(12) United States Patent
Iwaki et al.

(10) Patent No.: US 7,350,175 B2
(45) Date of Patent: Mar. 25, 2008

(54) CIRCUIT BOARD DESIGN SYSTEM, DESIGN DATA ANALYSIS METHOD AND RECORDING MEDIUM WITH ANALYSIS PROGRAM RECORDED THEREON

(75) Inventors: Hideki Iwaki, Ibaraki (JP); Yukinobu Furukawa, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 253 days.

(21) Appl. No.: 11/238,166

(22) Filed: Sep. 28, 2005

(65) Prior Publication Data

US 2006/0070015 A1    Mar. 30, 2006

(30) Foreign Application Priority Data

Sep. 29, 2004    (JP) .............................. 2004-283850

(51) Int. Cl.
G06F 17/50 (2006.01)
G06F 9/455 (2006.01)

(52) U.S. Cl. .......................................... 716/11; 716/15

(58) Field of Classification Search ................... 716/15, 716/11, 12
See application file for complete search history.

(56) References Cited

U.S. PATENT DOCUMENTS 5,004,317 A * 4/1991 Jackson et al. ............... 385/38
6,871,334 B2 * 3/2005 Mabuchi et al. ............... 716/5
7,120,893 B2 * 10/2006 Sasaki et al. .................. 716/15

FOREIGN PATENT DOCUMENTS

| EP | 0 845 746 | 6/1998 |
| JP | 5-20403 | 1/1993 |
| JP | 10-214281 | 8/1998 |
| JP | 2001-202396 | 7/2001 |

* cited by examiner

Primary Examiner—Jack Chiang
Assistant Examiner—Magid Y. Dimyan
(74) Attorney, Agent, or Firm—Hamre, Schumann, Mueller & Larson, P.C.

(57) ABSTRACT

The design system, which is equipped with capability to analyze circuit board design data, comprises a storing section for recording design data, including structure data, circuit data, and element data; a selection section for selecting a pair of circuit elements subject to interference analysis among circuit elements placed on a circuit board, represented by the structure data; a substitution section for acquiring element data concerning circuit elements selected by the selection section from the design data and, based on element data, generating equivalent circuit data representing electromagnetic coupling within the pair of circuit elements with the help of an equivalent circuit; and an analysis section for calculating an amount of interference within the pair of circuit elements by analyzing data produced by combining the equivalent circuit data with the circuit data.

19 Claims, 30 Drawing Sheets

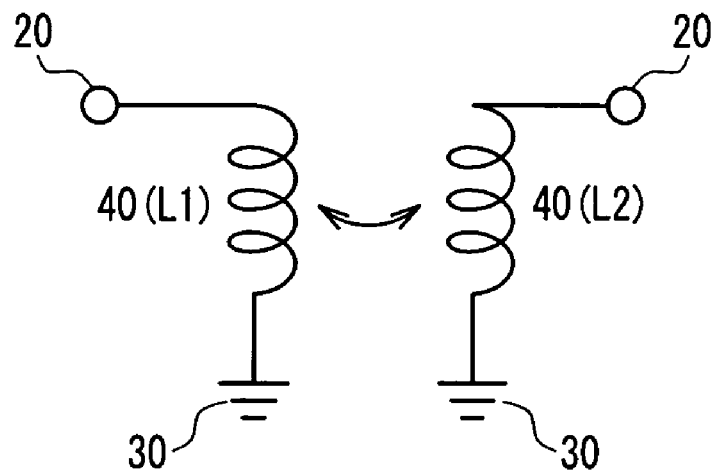
FIG. 10A
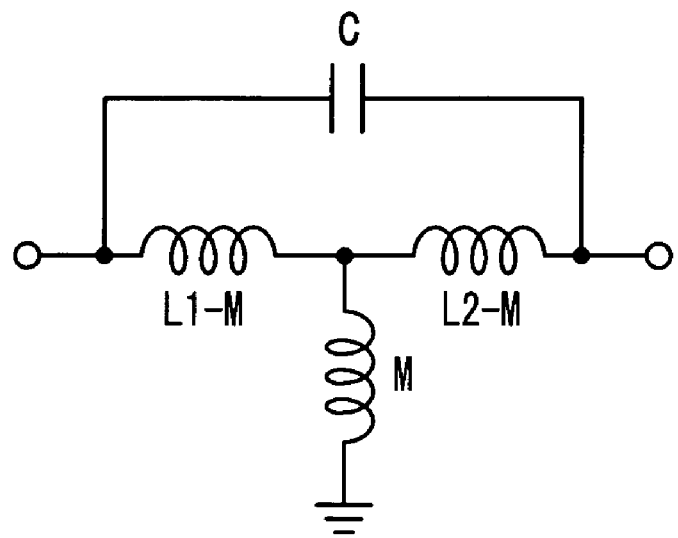
FIG. 10B
FIG. 10C
```
.SUBCKT sample N1 N2 N3 N4
L1 N1 N3 1.5013e-07
L2 N2 N4 1.0034e-07
K1 L1 L2 0.5
C12 N1 N2 1.53e-12
.END SECTION
```

CIRCUIT BOARD DESIGN SYSTEM, DESIGN DATA ANALYSIS METHOD AND RECORDING MEDIUM WITH ANALYSIS PROGRAM RECORDED THEREON

The present application claims the benefit of foreign priority of Japanese Application No. 2004-283850 filed on Sep. 29, 2004, which is herewith incorporated by reference in its entirety.

BACKGROUND OF THE INVENTION

1. Field of the Invention

The present invention relates to a circuit board design system, a design data analysis method, and an analysis program equipped with the capability to analyze design data for circuits built on circuit boards, such as printed circuit boards, semiconductor integrated circuits, etc.

2. Description of Related Art

In recent years, printed circuit board design often has been done with the help of computer-based printed circuit board CAD (Computer Aided Design). Despite the high degree of automation in CAD device-based printed circuit board design, there still are quite a few things that cannot be properly designed if the designer is unskilled. Therefore, a number of technologies have been proposed that permit proper design even by users who are not skilled designers.

A printed circuit board CAD device described in JP H10-214281A comprises parameter derivation means for deriving unknown design parameters from known design parameters using design parameter-related rules. Thus, even users who are not skilled designers can operate it simply by inputting known design parameters. As a result, it is possible to get rid of operations performed by skilled designers to determine the design parameters of wiring (foil width, termination resistance values, etc.) based on their own long experience and on analysis results when designing, for instance, high-speed clock signal lines that require impedance matching, etc.

Moreover, an automatic interference checking system, which checks for contact between components using component models with defined boundaries in a computer-aided design system, has been disclosed in JP H5-20403A. The above-mentioned automatic interference checking system makes use of component models with defined boundaries to ensure control aimed at preventing components from entering into contact with one another and displays them on a monitor. As a result, it becomes possible to omit an operation related to component overlap checking (interference checking) in three dimensional computer models, which normally require careful observation on the part of the user.

In addition, JP 2001-202396A disclosed a printed circuit board CAD device that displays, in easily identifiable visual form, the results of checks that determined whether the height of components mounted to a printed circuit board satisfied height restrictions. With such a printed circuit board CAD device, it was easy for the user to perform visual component height checks during printed circuit board design.

As described above, the printed circuit board CAD device provides support for setting up the design parameters of wiring, as well as support for contact checks in three-dimensional models, etc. However, components placed in a mutually spaced relationship may interfere with one another electromagnetically. The reality is that the presence of such electromagnetic interaction between components is the reason why design patterns are still subject to visual checks based on the know-how of skilled designers. Therefore, the availability of skilled designers has been indispensable for design that accounts for electromagnetic interaction between components.

SUMMARY OF THE INVENTION

Accordingly, it is an object of the present invention to provide a design system, an analysis method, and an analysis program capable of analyzing electromagnetic interaction between circuit elements forming part of circuits built on circuit boards. It is another object of the present invention to provide a circuit design apparatus capable of such circuit board design.

The design system of the present invention, which is a design system equipped with the capability to analyze design data for a circuit board having circuit elements and wiring placed thereon, comprises a storing section that stores the design data including structure data representing the structure of the circuit elements and wiring placed on the circuit board, circuit data representing circuits built from the circuit elements and the wiring, and element data concerning the circuit elements; a selection section that selects pairs of circuit elements subject to interference analysis among the circuit elements placed on a circuit board represented by the structure data; a substitution section that acquires element data concerning the circuit elements selected by the selection section from the design data and generates equivalent circuit data representing electromagnetic coupling within the pairs of circuit elements using equivalent circuits based on the element data; and an analysis section that calculates the amount of interference within the pairs of circuit elements by analyzing data obtained by combining the equivalent circuit data with the circuit data.

In the design system of the present invention, the substitution section substitutes equivalent circuits for electromagnetic coupling within the pairs of circuit elements selected by the selection section and represents them as the equivalent circuit data. Therefore, the analysis section can obtain the degree of electromagnetic coupling, i.e. the amount of interference, within the pairs of circuit elements by analyzing circuits reflecting the equivalent circuit data. As a result, the analysis section can analyze electromagnetic interaction between circuit elements forming part of circuits built on circuit boards. Consequently, circuit board design that accounts for electromagnetic interaction between circuit elements is made possible.

Moreover, since the analysis section obtains the interference amount by analyzing the circuits, analysis can be carried out using fewer calculations and at a higher speed than, for instance, when the amount of the interference is obtained by electromagnetic field analysis using finite element techniques, etc.

Moreover, since the substitution section generates equivalent circuit data for pairs of circuit elements selected by the selection section, and not for all the circuit elements on the circuit board, analytical processing is carried out only with respect to circuit elements that are required for analysis. Therefore, the amount of processing necessary for analysis is reduced.

In addition to printed circuit boards, circuit boards also include substrates for integrated circuits and the like.

The present invention can provide a design system, an analysis method, and an analysis program capable of analyzing electromagnetic interaction between circuit elements forming part of circuits built on circuit boards.

BRIEF DESCRIPTION OF THE DRAWINGS

FIG. 10A is a circuit diagram representing an example of an inductor pair. FIG. 10B illustrates an example of an equivalent circuit representing electromagnetic coupling between the inductor 40(L1) and the inductor 40(L2). FIG. 10C illustrates an example of a netlist representing the equivalent circuit illustrated in FIG. 10B.

DETAILED DESCRIPTION OF THE INVENTION

Figure 1:
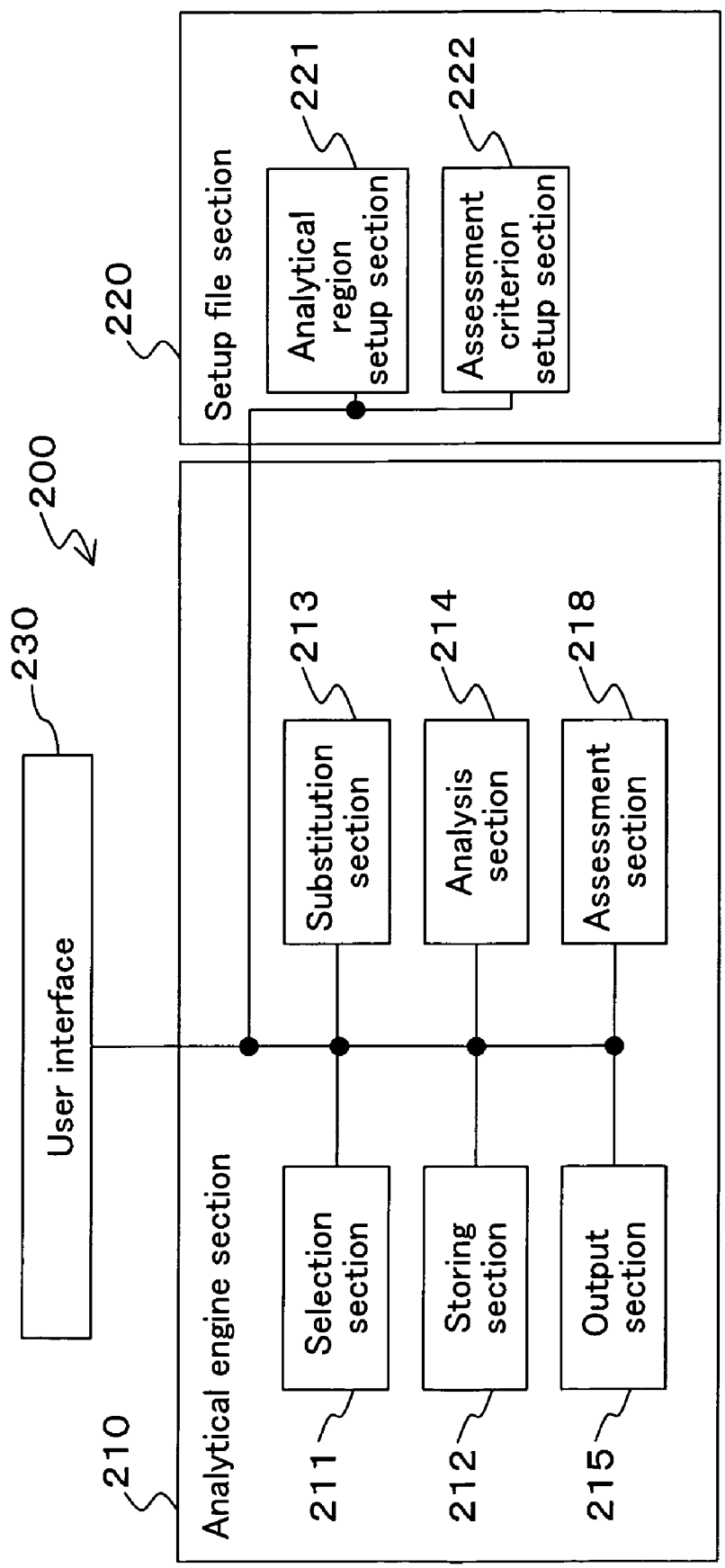
FIG. 1 is a functional block diagram representing the configuration of the design system 200.

The design system of the present invention preferably further includes a model storing section that stores equivalent circuit models of electromagnetic coupling occurring within pairs of circuit elements, with the substitution section acquiring the equivalent circuit models from the model storing section and generating the equivalent circuit data using the acquired equivalent circuit models.

The substitution section can generate equivalent circuit data representing electromagnetic coupling within pairs of circuit elements using the equivalent circuit model of the circuit element recorded in the model storing section. The equivalent circuit model includes data representing the configuration of an equivalent circuit representing electromagnetic coupling within pairs of circuit elements.

In the design system of the present invention, the substitution section preferably uses the element data acquired from the design data to calculate values representing the characteristics of the equivalent circuits and generate the equivalent circuit data.

The substitution section can obtain values representing the characteristics of the equivalent circuits using the element data acquired from the design data. The values representing the characteristics of the equivalent circuits are values that represent, for instance, the characteristics of the circuit elements forming part of the equivalent circuits.

The design system of the present invention preferably further comprises a setup file section that stores, as condition data, data representing regions subject to analysis on the circuit board, with the selection section selecting pairs of circuit elements located within the regions represented by the condition data.

By doing so, the selection section can select only the circuit elements located in the region that requires analysis. As a result, the amount of processing necessary for analysis is reduced because processing is performed in the region that requires analysis.

The design system of the present invention preferably further comprises a setup file section that stores, as condition data, data representing assessment criteria for the amount of interference between circuit elements, and an assessment section that provides an assessment of the presence/absence of interference within the pair of circuit elements by comparing the assessment criteria with the amount of the interference within the pair of circuit elements calculated by the analysis section.

By doing so, the analysis section can extract, as problem locations, pairs of circuit elements in which the amount of interference exceeds the assessment criteria.

The design system of the present invention preferably further comprises a setup file section that stores, as condition data, data representing maximum values of the distance between circuit elements subject to analysis, with the selection section selecting pairs of circuit elements that are spaced at a distance equal to or smaller than the maximum values.

Because the selection section selects pairs of circuit elements, for which the distance between the circuit elements is equal to or smaller than the maximum values, it is possible to select only those pairs of circuit elements in which electromagnetic interaction may present a problem. As a result, circuit elements that are supposed to be analyzed are selected, and circuit elements that don't need to be analyzed are not selected, which provides for efficient analysis.

The design system of the present invention preferably further comprises a setup file section that stores, as condition data, data representing the maximum and minimum values of the values representing the characteristics of the equivalent circuits, with the substitution section generating the equivalent circuit data by considering the equivalent circuits as open circuits when the values representing the characteristics of the equivalent circuits are greater than the maximum values and considering the equivalent circuits as short circuits when the values representing the characteristics of the equivalent circuits are smaller than the minimum values.

Thus, when values representing the characteristics of the equivalent circuits exceed a certain range, the equivalent circuit data generated by the substitution section is simplified, thereby facilitating processing that utilizes the equivalent circuit data. As a result, analytical processing is accelerated.

The design system of the present invention preferably further comprises a setup file section that stores, as condition data, data comprising data that represent frequency domains subject to analysis and ranges of the amount of interference between circuit elements that are to be taken into consideration, and a characteristic value range determination section that obtains the maximum values and the minimum values of the values representing the characteristics of the equivalent circuits based on the frequency domains and the ranges of the amount of interference.

Because the characteristic value range determination section obtains the maximum and minimum values of the values representing the characteristics of the equivalent circuits based on the frequency domains and the amount of interference, the resultant range of values representing the characteristics of the equivalent circuits reflects the frequency domains subject to analysis and the interference amount ranges subject to analysis. Namely, ranges of values representing the characteristics of the equivalent circuits between circuit elements are obtained, in which the amount of interference is within the analytical range in the frequency domain under analysis.

The design system of the present invention preferably further comprises a setup file section that stores condition data representing the conditions of processing in at least either one of the selection section, the substitution section and the analysis section and a user interface accepting information input from users and recording the condition data in the setup file section based on the information input. With the help of the user interface, users can set up the desired condition data.

The design system of the present invention preferably further comprises an output section that displays information representing the amount of interference within the pairs of circuit elements obtained by the analysis section in association with the configuration of the circuit board represented by the design data. Using the display of the output section, users can confirm analysis results visually.

In the design system of the present invention, the design data preferably includes data representing net groups obtained by grouping similar nets among nets contained in the circuits of a circuit board into a single group, and, in a case where there is a plurality of net groups, the selection section selects a circuit element connected to a certain net group and a circuit element connected to another net group to form the pairs of circuit elements.

This method is used to select pairs of circuit elements in locations requiring interference amount analysis. As a result, the analytical process is performed only with respect to locations requiring interference amount analysis.

Nets are circuit units connected in the form of electrical circuits. Net groups are obtained by combining similar electrical circuit networks into a single group. For instance, a collection of nets connected to a clock signal line of the same clock frequency (e.g. 100 MHz) can be combined into a single group referred to as the 100-MHz net group and a collection of nets connected to a power supply can be combined into a single group referred to as the power supply net group.

In the design system of the present invention, the selection section preferably selects inductor pairs as the pairs of circuit elements, and the substitution section preferably acquires, as the element data, at least information representing the coordinates of the elements of the inductors, information representing the direction of placement of the inductors, information representing electrical connections of the terminals of the inductors, and information representing the characteristics of the inductors.

The design system of the present invention is a design system equipped with the capability to analyze design data for circuit boards having circuit elements placed thereon and comprises a storing section that stores design data representing the circuit boards and circuit elements placed thereon, a display section that displays the configuration of the circuit boards and circuit elements represented by the design data on screen, an updating section that updates the configuration of the circuit elements displayed by the display section based on information input from outside, a selection section that selects pairs of circuit elements subject to interference analysis among circuit elements placed on a circuit board represented by the design data when the configuration of the circuit elements is updated by the updating section, a substitution section that acquires element data concerning the circuit elements selected by the selection section from the design data and generates equivalent circuit data produced by substitution with an equivalent circuits for electromagnetic coupling within the pairs of circuit elements based on the element data, an analysis section that obtains the amount of interference within the pairs of circuit elements by analyzing circuits obtained by reflecting the equivalent circuit data in the circuits of the circuit board represented by the design data, and the display section displays data representing the interference amount obtained by the analysis section along with the updated circuit elements when the configuration of the circuit elements is updated by the updating section.

Because the substitution section substitutes the equivalent circuit data for electromagnetic coupling between circuit elements selected by the selection section and the analysis section obtains the interference amount by analyzing circuits incorporating the equivalent circuit data, the interference amount is calculated at a higher speed than, for instance, when the interference amount is obtained by electromagnetic field analysis using finite element techniques, etc. Therefore, the amount of interference is determined in real time whenever the configuration of the circuit elements represented by the design data is updated by the updating section. For this reason, when the configuration of circuit elements displayed by the display section is updated, the user can immediately learn the amount of interference between circuit elements after the update. As a result, the user can carry out circuit board design, taking into account electromagnetic interaction between circuit elements.

The design system of the present invention is a design system for circuit boards having a plurality of inductors and comprises a storing section that stores design data for the circuit boards, a selection section that selects a first inductor connected to one of the terminals of a circuit element placed on the circuit boards and a second inductor connected to the other terminal corresponding to the terminal from the design data, a polarity assessment section that provides an assessment as to whether the mutual inductance between the first inductor and the second inductor is positive or negative, and a correction section that applies corrections to the design data when the mutual inductance is negative such that the orientation of the first inductor or the second inductor is modified in order to render the mutual inductance positive.

The correction section can correct the configuration of first inductor and the second inductor so as to suppress the degradation of the attenuation characteristic of the circuit element by modifying the orientation of the first inductor or the second inductor such that the mutual inductance is rendered positive in case said mutual inductance is negative. As a result, design is made possible that suppresses the degradation of characteristics of the circuit elements induced by electromagnetic interaction between the first inductor and the second inductor.

The circuit elements are, for instance, elements such as filters, amplifiers, switches, shared antenna devices or baluns, etc. Baluns are elements used to connect devices built from balanced circuits with devices built from unbalanced circuits.

The design system of the present invention is a design system for circuit boards having a plurality of inductors placed thereon and comprises a storing section that stores design data for the circuit boards, a selection section that selects a first inductor connected to one of the terminals of a circuit element with at least two terminals placed on the circuit boards and a second inductor connected to the other terminal corresponding to the terminal from the design data, a capacitance calculation section that calculates parasitic capacitance between the first inductor and the second inductor, a mutual inductance calculation section that calculates a mutual inductance between the first inductor and the second inductor, a frequency calculation section that obtains the resonance frequency of the first inductor and the second inductor, which is expressed using the parasitic capacitance and the mutual inductance, and a correction section that applies corrections to the design data so as to modify the distance between the first inductor and the second inductor in order to match the resonance frequency to the frequency characteristic required for the circuit elements.

Because the resonance frequency calculated by the frequency calculation section varies depending on the parasitic capacitance, the correction section can change the value of the parasitic capacitance in order to match the resonance frequency to the frequency characteristic required for the circuit elements, by adjusting the distance between the first inductor and the second inductor.

In the design system of the present invention, the frequency calculation section preferably obtains the resonance frequency using Expression 1 below, in which L1 is the self-inductance of the first inductor, L2 is the self-inductance of the second inductor, M is the mutual inductance between the first inductor and the second inductor, C is the parasitic capacitance, and $\alpha$ is a constant.

$$f = \frac{\alpha}{2\pi} \times \frac{1}{\sqrt{L1 \cdot L2}} \times \sqrt{\frac{|M|}{C}} \qquad \text{Expression 1}$$

In the design system of the present invention, the first inductor and the second inductor are preferably inductors having the same winding direction.

The analysis method of the present invention is an analysis method for, utilizing a computer, analyzing the design data, including structure data representing the structure of circuit elements and wiring placed on a circuit board, circuit data representing circuits built from the circuit elements and the wiring, and element data concerning the circuit elements, and comprises a selection step, in which a selection section provided in the computer selects pairs of circuit elements subject to interference analysis among circuit elements located on the circuit board represented by the structure data; substitution processing, during which a substitution section provided in the computer acquires element data concerning the circuit elements selected in the selection step from the design data and generates, based on the element data, equivalent circuit data representing electromagnetic coupling within the pairs of circuit elements using an equivalent circuit; and an analytical step, in which an analysis section provided in the computer analyzes data obtained by combining the equivalent circuit data and the circuit data in order to calculate the amount of interference within the pairs of circuit elements.

The analysis program of the present invention is an analysis program directing a computer to carry out processing to analyze the design data, including structure data representing the structure of the circuit elements and wiring placed on the circuit board, circuit data representing circuits built from the circuit elements and the wiring, and element data concerning the circuit elements, and comprises directing a computer to carry out selection processing, during which pairs of circuit elements subject to interference analysis are selected from among the circuit elements placed on a circuit board represented by the structure data; substitution processing, during which element data concerning the circuit elements selected during the selection processing is acquired from the design data and, based on the element data, equivalent circuit data is generated that represents electromagnetic coupling within the pairs of circuit elements using an equivalent circuit; and analytical processing, during which data obtained by combining the equivalent circuit data with the circuit data is analyzed to calculate the amount of interference within the pairs of circuit elements.

The circuit board design method of the present invention is a design method for a circuit board having a plurality of inductors placed thereon and includes a step (a) of selecting inductor pairs subject to interference analysis, a step (b) of acquiring interference characteristic information concerning the inductors from an information database, a step (c) of substituting equivalent circuits for the circuits comprising the inductor pairs based on the interference characteristic information, and a step (d) of carrying out interference analysis of the equivalent circuits.

A preferred embodiment further includes a step of setting up analysis conditions used for carrying out interference analysis, and the analysis condition setup step includes a step of setting up an analytical region and a step of setting up a permissible limit of interference, with the inductor pairs in the step (a) being extracted from the analytical region set up in the analytical region setup step.

In a preferred embodiment, in the step (b), information concerning the coordinates of the location of the elements of the inductors, information concerning the orientation of the inductors, information concerning the electrical connections of the inductors, and element characteristic information concerning the inductors is acquired as the interference characteristic information.

The plurality of inductors preferably consists of inductors having the same winding direction.

The inductors are preferably chip inductors.

In a preferred embodiment, substitution in the step (c), as well as the step (d), preferably is carried out using a microcomputer.

In a preferred embodiment, a step of displaying inductor pairs whose analysis has revealed electromagnetic interference-induced faults is carried out subsequent to the step (d).

Another circuit board design method of the present invention is a design method for a circuit board having a plurality of inductors placed thereon and comprises a step of selecting a first inductor connected to one of the two terminals of a filter or an amplifier and a second inductor connected to the other terminal corresponding to said first terminal, a step of calculating parasitic capacitance between the first inductor and the second inductor, and a step of calculating a mutual inductance between the first inductor and the second inductor.

When the mutual inductance is negative, it is preferable to carry out processing, whereby the orientation of the first inductor or the second inductor is modified so as to render said mutual inductance positive.

The plurality of inductors preferably consists of inductors having the same winding direction.

In a preferred embodiment, the inductor pairs are selected among inductors existing in the three-dimensional domain as well as in the two-dimensional domain.

The design method for semiconductor integrated circuits of the present invention is a design method for semiconductor integrated circuits including a step (a) of selecting inductor pairs subject to interference analysis, a step (b) of acquiring interference characteristic information concerning the inductors from an information database, a step (c) of substituting equivalent circuits for circuits comprising the inductor pairs based on interference characteristic information, and a step (d) of carrying out interference analysis of the equivalent circuits.

The circuit design system of the present invention is a circuit design system used for circuit design, comprising: an analytical engine section carrying out analysis of circuits, a setup file section configuring settings used for the analysis of circuits, and a user interface connected at least to the setup file section, with the setup file section including an analytical region setup section setting up an analytical region based on information input via the user interface and an assessment criterion setup section setting up an assessment criterion for the analysis of circuits based on information input via the user interface, and the analytical engine section including an analyzed component selection section selecting components subject to analysis based on the setup information of the analytical region setup section, a database section storing characteristic data for the components subject to analysis, an equivalent circuit substitution section substituting equivalent circuits for circuits comprising the components subject to analysis selected by the analyzed component selection section, an interference result assessment section performing interference analysis of the equivalent circuits generated by the equivalent circuit substitution section and providing an assessment of the results of the interference analysis based on the assessment criterion of the assessment criterion setup section, and an output section outputting the results of the interference analysis.

The recording medium of the present invention, which is a recording medium for storing a circuit design program used for carrying out circuit design on a computer, is a computer-readable storage medium comprising: a program directing the computer to carry out a step (a) of selecting inductor pairs subject to interference analysis, a step (b) of acquiring interference characteristic information regarding the inductors from an information database, a step (c) of substituting equivalent circuits for the circuits comprising the inductor pairs based on the interference characteristic information, and a step (d) of carrying out interference analysis of the equivalent circuits.

According to the circuit board design method of the present invention, after selecting inductor pairs subject to interference analysis, equivalent circuits are substituted for the circuits comprising the inductor pairs based on the interference characteristic information concerning the inductors, followed by interference analysis of the equivalent circuits, so that a circuit board design method can be provided that accounts for electromagnetic interaction between inductors (components).

In addition, calculating parasitic capacitance between a first inductor and a second inductor after selecting a first inductor and a second inductor connected to both terminals of a filter or an amplifier and then calculating a mutual inductance between the first inductor and the second inductor also provides for circuit board design that accounts for electromagnetic interaction between inductors. Here, when the mutual inductance is negative, the degradation of the characteristics of the filter or amplifier can be suppressed if the orientation of the first inductor or the second inductor is modified so as to render said mutual inductance positive.

The present inventor(s) thought that CAD design of printed circuit boards could be accomplished more smoothly if checks for electromagnetic interaction between circuit elements such as inductors were performed automatically. Subsequently, the present inventor(s) arrived at the present invention as a result of in-depth investigations into methods of such printed circuit board design. Boards with embedded components and bendable flexible boards have been used as printed boards (circuit boards) in recent years. Therefore, it is desirable to consider electromagnetic interaction between circuit elements such as inductors not only in the two-dimensional domain, but also in the three-dimensional domain. It would be very convenient if a computer could perform such three-dimensional contemplation automatically, because it is difficult to make judgments about the three-dimensional domain based on ordinary planar circuit design data.

Below, embodiments of the present invention are explained by referring to drawings. In order to simplify explanations, in the following drawings, constituent elements that have substantially identical functions are designated with the same reference numerals. It should be noted that the present invention is not limited to the embodiments below.

EMBODIMENT 1

FIG. 1 is a functional block diagram representing the configuration of the design system 200 used in the present embodiment. The design system 200 is a CAD system equipped with the capability of analyzing design data for circuits built from circuit elements placed on a circuit board.

The design system 200 illustrated in FIG. 1 comprises an analytical engine section 210 carrying out analysis of circuits represented by design data, a setup file section 220 used for recording settings used in the above-mentioned analysis of circuits, and a user interface 230 connected to the analytical engine section 210 and to the setup file section 220. It should be noted that, for instance, the user interface 230 may be connected to the analytical engine section 210 through the setup file section 220.

The analytical engine section 210 comprises a selection section 211, a storing section 212, a substitution section 213, an analysis section 214, an assessment section 218, and an output section 215. Design data for circuits built on circuit boards is recorded in the storing section 212. This is the data subject to analysis by the analytical engine section 210.

The setup file section 220 comprises an analytical region setup section 221 and an assessment criterion setup section 222. The analytical region setup section 221 is used for recording information representing analytical regions inputted via the user interface 230. The assessment criterion setup section 222 is used for recording information representing assessment criteria inputted via the user interface 230.

Based on the setup information of the analytical region setup section 221, the selection section 211 selects pairs of circuit elements subject to analysis from among circuit elements represented by the above-mentioned setup data. The substitution section 213 generates equivalent circuit data representing electromagnetic coupling within the pairs of circuit elements subject to analysis selected by the selection section 211 using equivalent circuits. Namely, the substitution section 213 substitutes the equivalent circuits for electromagnetic coupling within the pairs of circuit elements. When the substitution section 213 generates equivalent circuit data, it acquires element data for the circuit elements selected by the selection section 211 from the above-mentioned setup data recorded in the storing section 212 and uses the element data to generate the above-mentioned equivalent circuit data.

The analysis section 214 performs analysis of circuits represented by the above-mentioned design data using the equivalent circuits generated by the substitution section 213. As a result, the amount of interference between the circuit elements selected by the selection section 211 is obtained. The assessment section 218 assesses the presence of interference within the circuit element pairs by comparing the amount of interference calculated by the analysis section 214 with the assessment criterion recorded by the assessment criterion setup section 222. The output section 215 outputs the results of the assessment by the assessment section 218 and the results of the interference analysis conducted by the analysis section 214.

Figure 2:
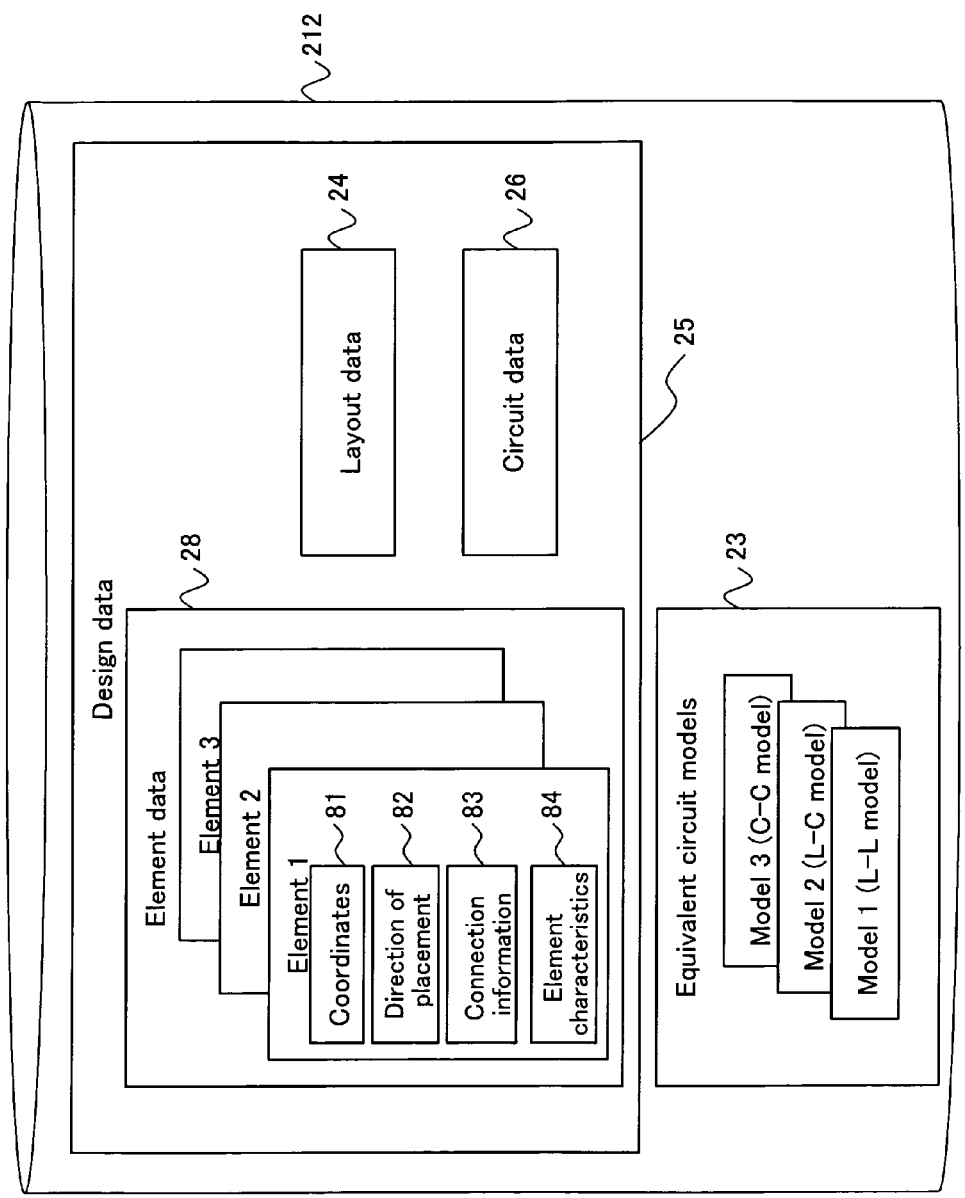
FIG. 2 illustrates an example of the content of data recorded in the storing section 212.

FIG. 2 illustrates an example of the content of data recorded in the storing section 212. The design data 25 and equivalent circuit models 23 are recorded in the storing section 212. The design data 25 includes element data 28, layout data 24, and circuit data 26.

The element data 28 includes information concerning elements placed on the circuit board, with data provided for each element. Information recorded about each element includes, for instance, information representing the coordinates 81 of the location where the element is placed, the direction of placement 82 of the element, information 83 on the connections of the element, information representing element characteristics 84, etc.

The layout data 24 is, for instance, information representing the structure of the circuit board and the configuration etc. of the wiring and elements placed on the circuit board. The layout data 24 includes, for instance, information representing wiring coordinates, wiring length, wiring width, wiring pitch, land position and dimensions, via coordinates and dimensions, etc.

The circuit data 26, for instance, is made up of information representing equivalent circuits for all the circuits built on the circuit board. Equivalent circuits represented by the circuit data 26 are recorded, for instance, in the form of a "netlist". A netlist describes a circuit by segmenting it into a plurality of units called "nets". Each net includes, for instance, the names of the circuit elements included in the net, as well as information such as element values, identification numbers etc. of the terminals of the net, etc.

Figure 3:
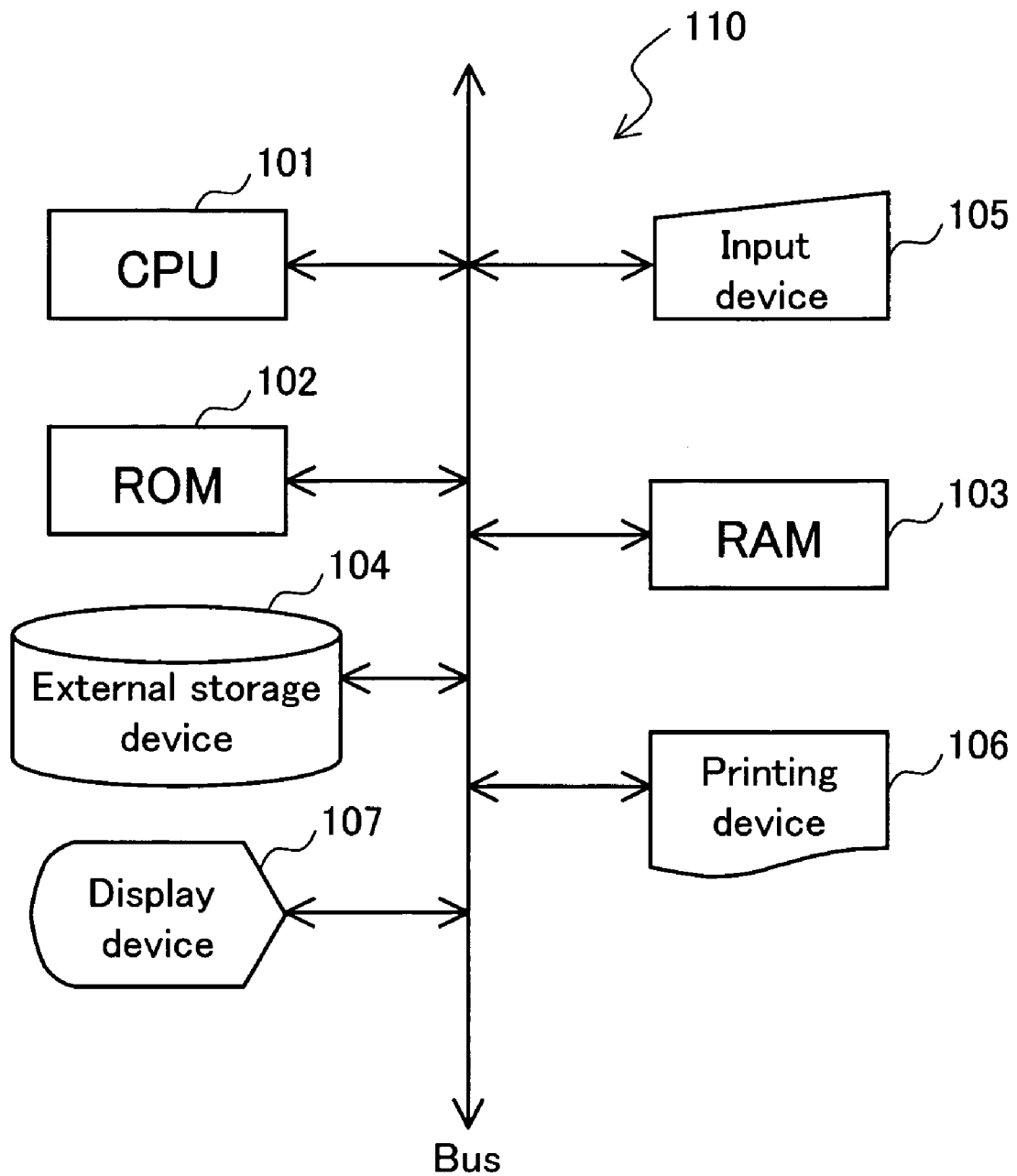
FIG. 3 is a block diagram illustrating an example of a hardware configuration of the computer 110 used to implement the circuit board design system.

FIG. 3 is a diagram illustrating an example of the hardware configuration of the computer 110, around which the design system 200 is built.

The computer 110 illustrated in FIG. 3 comprises a CPU 101 (central processing unit), which performs computational processing, a ROM 102, in which programs etc. are stored, a RAM 103, which is used as a working area etc. for the CPU, an external storage device 104, in which various setup data etc. are stored, an input device 105, which receives input from the operator, a printing device 106, and a display device 107. The units are interconnected by busses, etc. The external storage device 104 is, for instance, a hard disk, a flash memory, a DVD, etc. The input device 105 is, for example, a keyboard, a mouse, etc. The printing device 106 is, for instance, a printer, and the display device 107 is, for instance, a liquid crystal display, a CRT, etc.

The functions of the selection section 211, substitution section 213, and analysis section 214 in the design system 200 are implemented, for instance, through the execution of predetermined software programs, recorded in the ROM 102, by the CPU 101. In addition, ordinary CAD programs preferably are recorded in the ROM 102. Thus, the user can use the computer 110 to perform CAD of printed circuit boards.

Moreover, programs used to implement the functions of the design system 200 can be recorded on recording media (for instance, optical recording media, magnetic recording media, magneto-optical recording media, flash memory, etc.) readable by computer. The computer 110 is, for instance, an ordinary personal computer, a server, etc.

It should be noted that the hardware configuration illustrated in FIG. 2 is merely an example, and the hardware configuration of the design system 200 is not limited thereto. For instance, the design system 200 may be made up of multiple computers. In addition, the printing device 106 also may be connected to the computer 110 via a network. Moreover, it is also possible to use a configuration, in which data communication between at least one of the input device 105, printing device 106, display device 107 and the computer 110 is carried out wirelessly.

The user interface 230 illustrated in FIG. 2 can be based on the input device 105 illustrated in FIG. 3. Moreover, the display device 107 and printing device 106 may be included with the user interface 230. The functions of the analytical engine section 210 can be implemented through the CPU 101, ROM 102, RAM 103, and the external storage device 104. The output section 215 included in the analytical engine section 210 can be based on the display device 107 and/or printing device 106. The setup file section 220 comprises at least one of the ROM 102, RAM 103, and external storage device 104.

Figure 4:
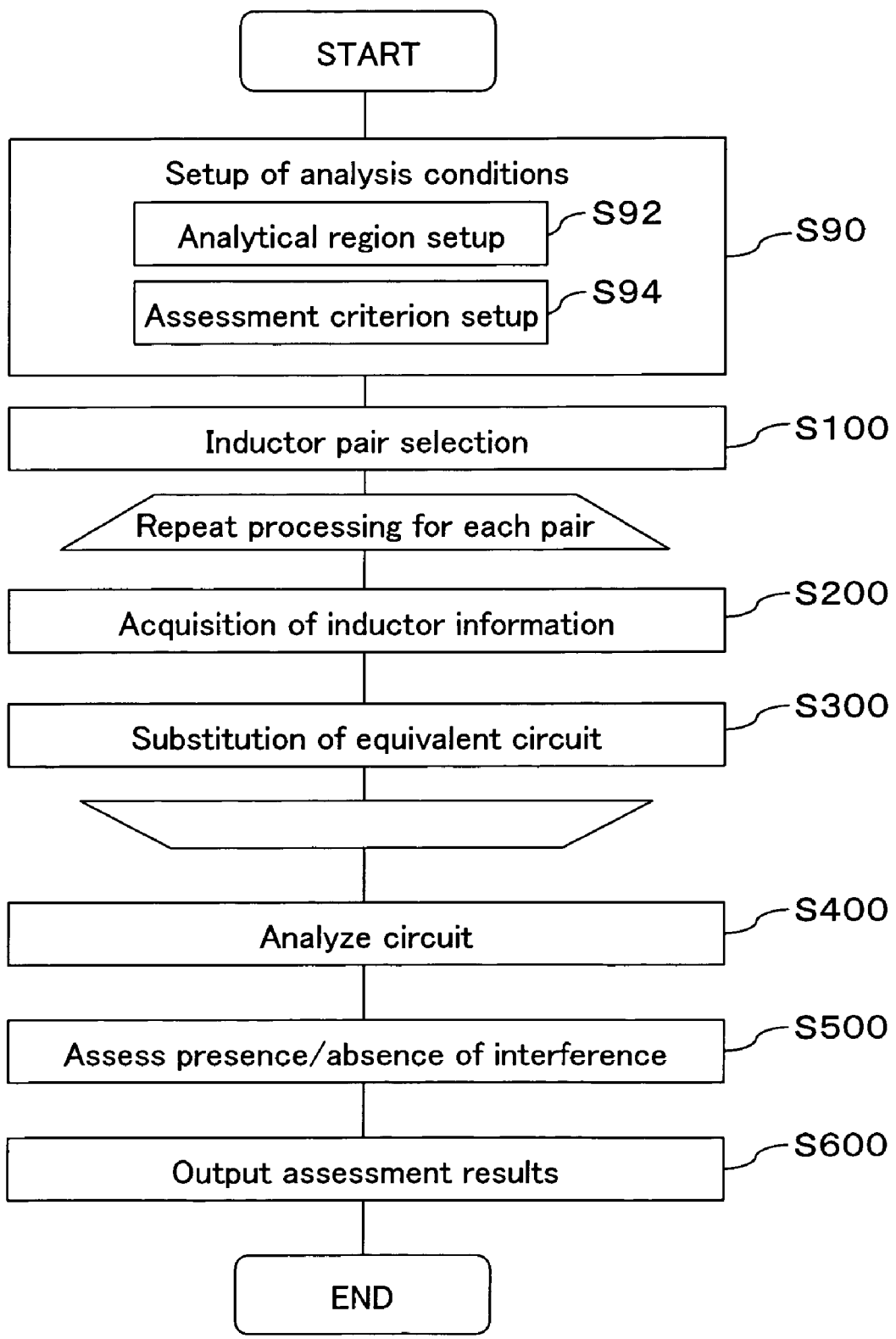
FIG. 4 is a flow chart illustrating the process flow of the design system 200.

Next, explanations will be provided regarding system operation during analysis of design data by the design system 200. FIG. 4 is a flow chart illustrating process flow during analysis of design data by the design system 200.

As an example, the process flow shown in FIG. 4 illustrates processing during analysis of design data for a circuit board having a plurality of inductors placed thereon. Here, explanations are given by providing an example of processing used to analyze the degree of interference between inductors placed on a circuit board.

The analytical processing illustrated in FIG. 4 comprises a step (S90) of setting up analysis conditions, a step (S100) of selecting inductor pairs subject to interference analysis, a step (S200) of acquiring interference characteristic information concerning the inductors from the storing section 212, a step (S300) of substituting equivalent circuits for circuits comprising inductor pairs based on the interference characteristic information, a step (S400) of carrying out interference analysis of the equivalent circuits, a step of assessing the presence/absence of interference-related problems (S500), and a step of outputting assessment results (S600).

In the step of setting up analysis conditions (S90), the analytical region setup section 221 records data representing regions subject to analysis inputted through the user interface 230 in the setup file section 220 (S92). Moreover, data inputted through the user interface 230, which represents a criterion (permissible limit of interference) for assessment of whether the amount of interference between inductors presents a problem, is recorded by the assessment criterion setup section 222 in the setup file section 220 (S94). In step S100, as described below, information is recorded in the setup file section 220 in order for the inductor pairs selected by the selection section 211 to be extracted from the region set up during the analytical region setup step (S90).

The setup of analysis conditions can be carried out by the user via the input device 105 illustrated in FIG. 2. Moreover, a system may be adopted in which analysis conditions are recorded in the external storage device 104 in advance and the analytical region setup section 221 or assessment criterion setup section 222 reads the analysis conditions recorded in the external storage device 104 and inputs them into the setup file section 220. The setup of the analytical region (S92) and the setup of the permissible limit of interference (S94) may be performed in any order.

Figure 5:
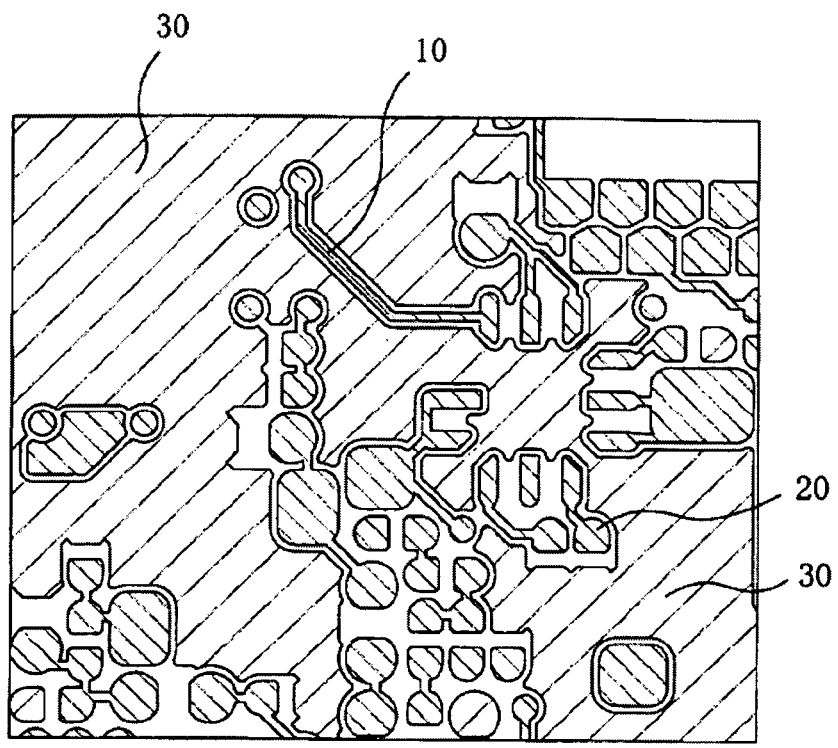
FIG. 5 illustrates an example of a screen outputted by the analytical region setup section 221 to the output section 215.

Here, explanations are provided regarding processing used to set up regions subject to analysis. FIG. 5 illustrates an example of a screen outputted by the analytical region setup section 221 to the output section 215 in the step of setting up regions subject to analysis. The analytical region setup section 221 produces an image of a circuit board based, for instance, on the wiring data, land data, and ground data included in the layout data 24 of the design data 25 and displays the image on the display device 107 as illustrated in FIG. 5. The image of the circuit board illustrated in FIG. 5 contains the layout of the ground 30 (ground plane), the layout of the lands 20, to which components are mounted, and the wiring 10.

Figure 6:
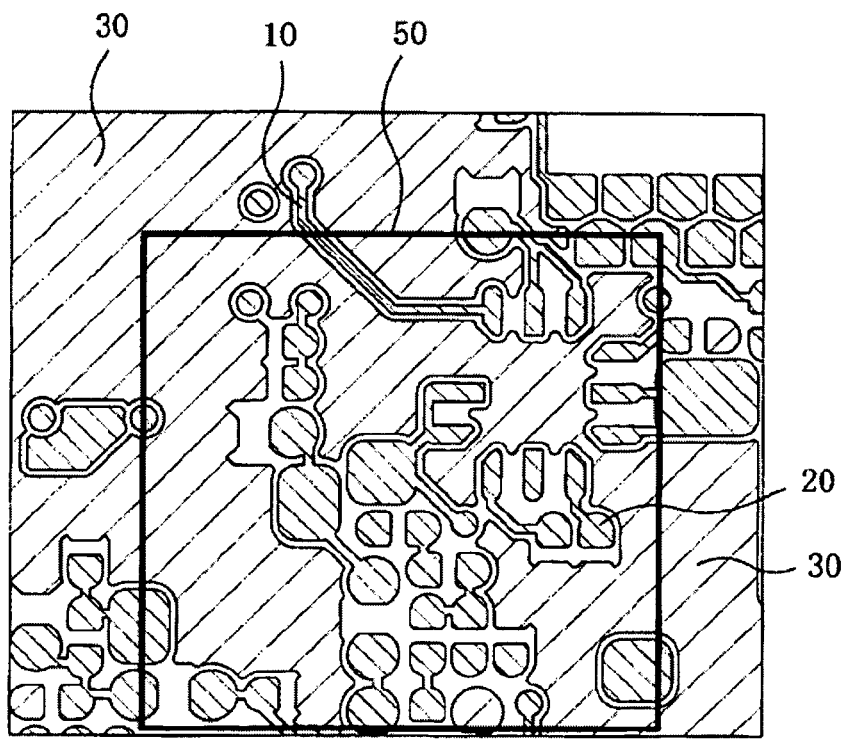
FIG. 6 illustrates an example, in which a user has specified an analytical region on the screen of the output section 215.

Data input representing the analytical region is received from the user via the user interface 230. FIG. 6 illustrates an example, in which the user specifies an analytical region on the screen of the output section 215. As shown in the example illustrated in FIG. 6, the user specifies an analytical region 50 using the input device 105 (e.g. a mouse). Although in the example illustrated in FIG. 6 the analytical region 50 is a rectangle, it also may be another polygon or a circle. Alternatively, the entire screen may be set up as an analytical region. Should the entire screen be set up as an analytical region 50, it is preferable to do so taking into account the speed of analytical processing etc. so as to avoid causing undue stress to the user. The user interface 230 may be equipped with the capability to display warnings to the effect that the operating time or waiting time is expected to be excessively long, or provided with the capability to prevent the entire screen from being set up as an analytical region when the operating time is expected to be protracted.

Figure 7:
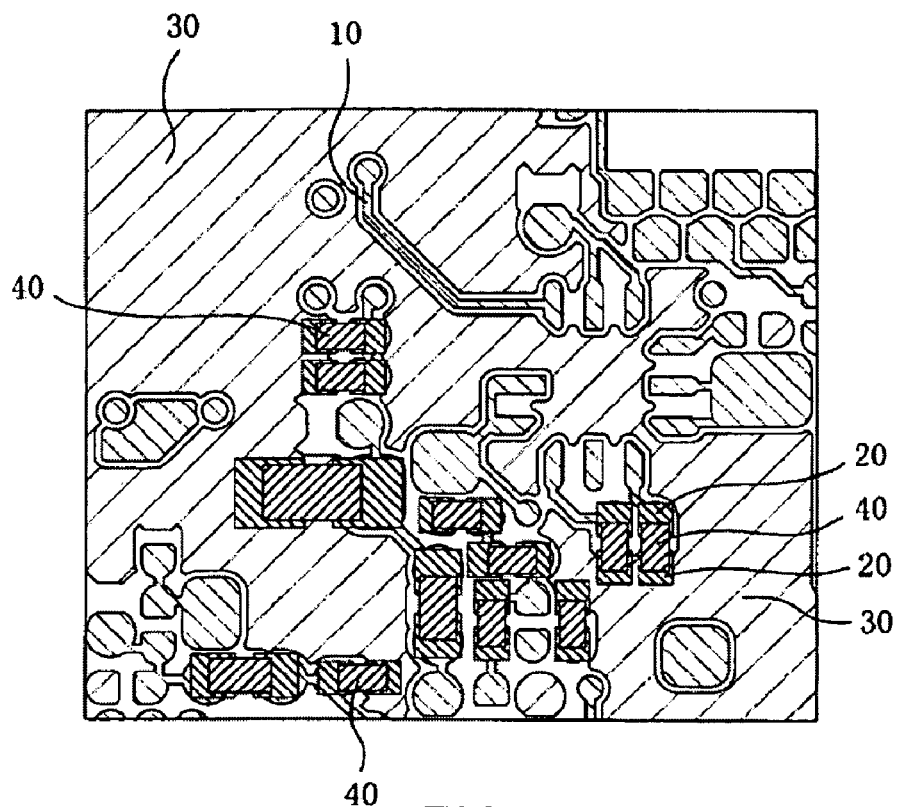
FIG. 7 illustrates an example of a screen obtained when the selection section 211 extracts inductors 40 located in the analytical region 50 and displays them in the output section 215.

Next, the selection section 211 extracts inductors contained in the analytical region 50. FIG. 7 illustrates an example of a screen obtained when the selection section 211 extracts inductors 40 located in the analytical region 50 and displays them in the output section 215. Information concerning the inductors 40 (more precisely, the layout of the inductors 40) is contained in the layout data 24 recorded in the storing section 212 and, in this step, it is read from the storing section 212 and displayed in the prescribed position. Here, each inductor 40 is displayed as mounted to either a land 20 or the ground 30.

Next, the selection section 211 selects an inductor pair subject to analysis from among the inductors 40 located in the analytical region 50 (S100). The selection section 211 can select, for instance, an inductor pair, for which the distance between the inductors is smaller than a fixed value. A plurality of inductor pairs may be selected.

The above-mentioned fixed value preferably is pre-recorded in the setup file section 220 in advance as data representing the maximum value of the distance between circuit elements subject to analysis. Moreover, a value inputted by the user through the user interface 230 can be used as the above-mentioned fixed value.

Moreover, when there is a plurality of inductors connected to a plurality of net groups in the analytical region 50, the selection section 211 can select a pair of inductors, among which one is connected to a certain specific net group and another is connected to another net group. For instance, the selection section 211 can select, as the pair to be analyzed, a pair made up of an inductor connected to the net group of a clock signal line with a clock frequency of 10 MHz and an inductor connected to the net group of a clock signal line with a clock frequency of 15 MHz.

It should be noted that it is desirable that information representing net groups in the circuits subject to analysis should be included in the design data 25 in advance. Moreover, information representing net groups may be inputted by the user through the user interface 230.

Thus, inductor pairs that may produce interference are selected from among the inductors located in the analytical region 50 (S100). The substitution section 213 acquires information concerning each inductor of the selected pairs from the storing section 212 (S200). The inductor information acquired here is, for instance, element data 28 recorded in the storing section 212.

Using the acquired element data 28, the substitution section 213 generates equivalent circuit data representing electromagnetic coupling within the inductor pair selected by the selection section 211. That is, the substitution section 213 substitutes equivalent circuits for electromagnetic coupling within the inductor pair (S300). The processing of S200 and S300 is executed repeatedly for each inductor pair selected by the selection section 211.

This generates equivalent circuit data for all the inductor pairs selected by the selection section 211. The equivalent circuit data are reflected in the circuit data 26, which represent equivalent circuits for the entire analytical region 50. The analysis section 214 carries out interference analysis of circuit data 26 reflecting the equivalent circuit data generated by the substitution section 213, i.e. circuit data 26 representing equivalent circuits for the entire analytical region 50 (S400). The analysis produces, for instance, the amount of interference within the inductor pairs selected by the selection section 211. The detailed processing of S300 and S400 will be described below.

Subsequently, the assessment section 218 makes an assessment of the analysis results of the analysis section 214 (S500). The assessment criterion set up by the assessment criterion setup section 222 is used for the assessment. For instance, an assessment is made as to whether the amount of interference within the inductor pair obtained as a result of analysis exceeds a permissible limit of interference, i.e. the assessment criterion. When the amount of interference exceeds the assessment criterion, the assessment section 218 makes an assessment that there is an interference problem, and when the amount of interference does not exceed the assessment criterion, it makes an assessment that there are no interference problems. By doing so, inductor pairs are extracted that are considered faulty in terms of electromagnetic interference. Finally, the assessment section 218 outputs the assessment results via the output section 215 (S600).

Figure 8:
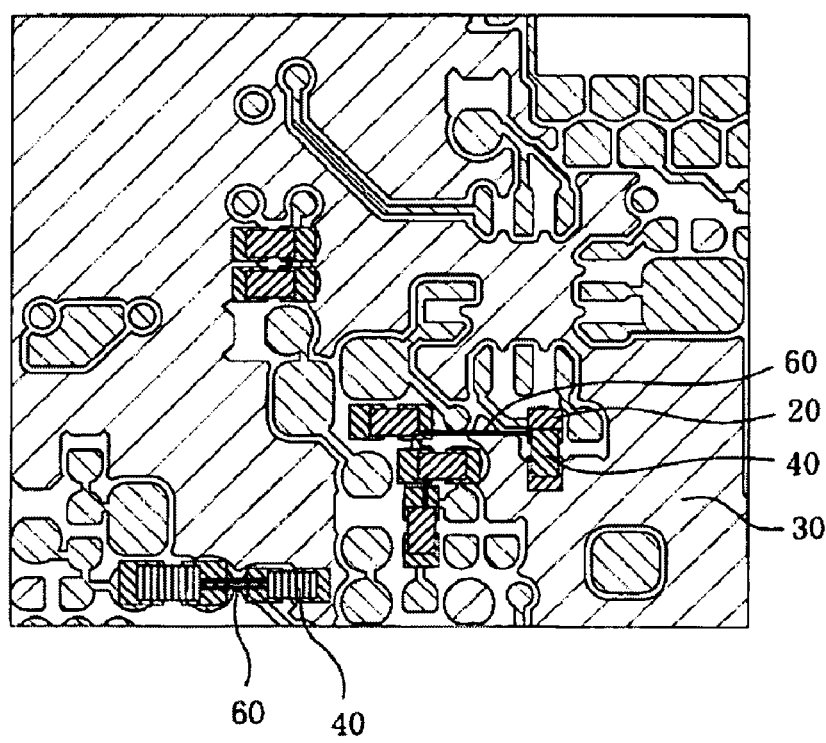
FIG. 8 illustrates an example of a screen displaying outputted assessment results.

FIG. 8 illustrates an example of a screen that displays outputted assessment results. In the example illustrated in FIG. 8, a pair of inductors 40 whose analysis shows it to be faulty in terms of electromagnetic interference is interconnected with a line 60. In addition, only the faulty pair of inductors 40 is displayed on screen, with good inductors 40 cleared from the screen. It should be noted that the method of displaying problem locations is not limited to using the line 60, and various other methods can be adopted as well, such as changing the color of the inductor pairs considered faulty, marking the regions comprising inductor pairs considered faulty, etc. In addition, in order to prevent inductor pairs considered faulty from being overlooked, an error warning may be issued when a faulty inductor pair is generated.

Thus, displaying inductor pairs whose analysis shows them to be faulty allows the user to verify errors visually. As a result, the level of convenience for the user is increased. The pairs can be displayed with the help of the display device 107 illustrated in FIG. 3.

The above completes the analytical processing. It should be noted that the setup of analysis conditions (S90), interference check assessment (S500), and output of assessment results (S600) can be omitted from the steps illustrated in FIG. 4. For instance, the step of setting up analysis conditions (S90) may be omitted and the processing of S100, S200, S300, and S400 may be carried out using pre-recorded data as the condition data. In addition, in the design system 200, analytical processing may end with data representing the analysis results of S400 being recorded in the storing section 212 so as to allow the user to display them at any time.

Figure 9:
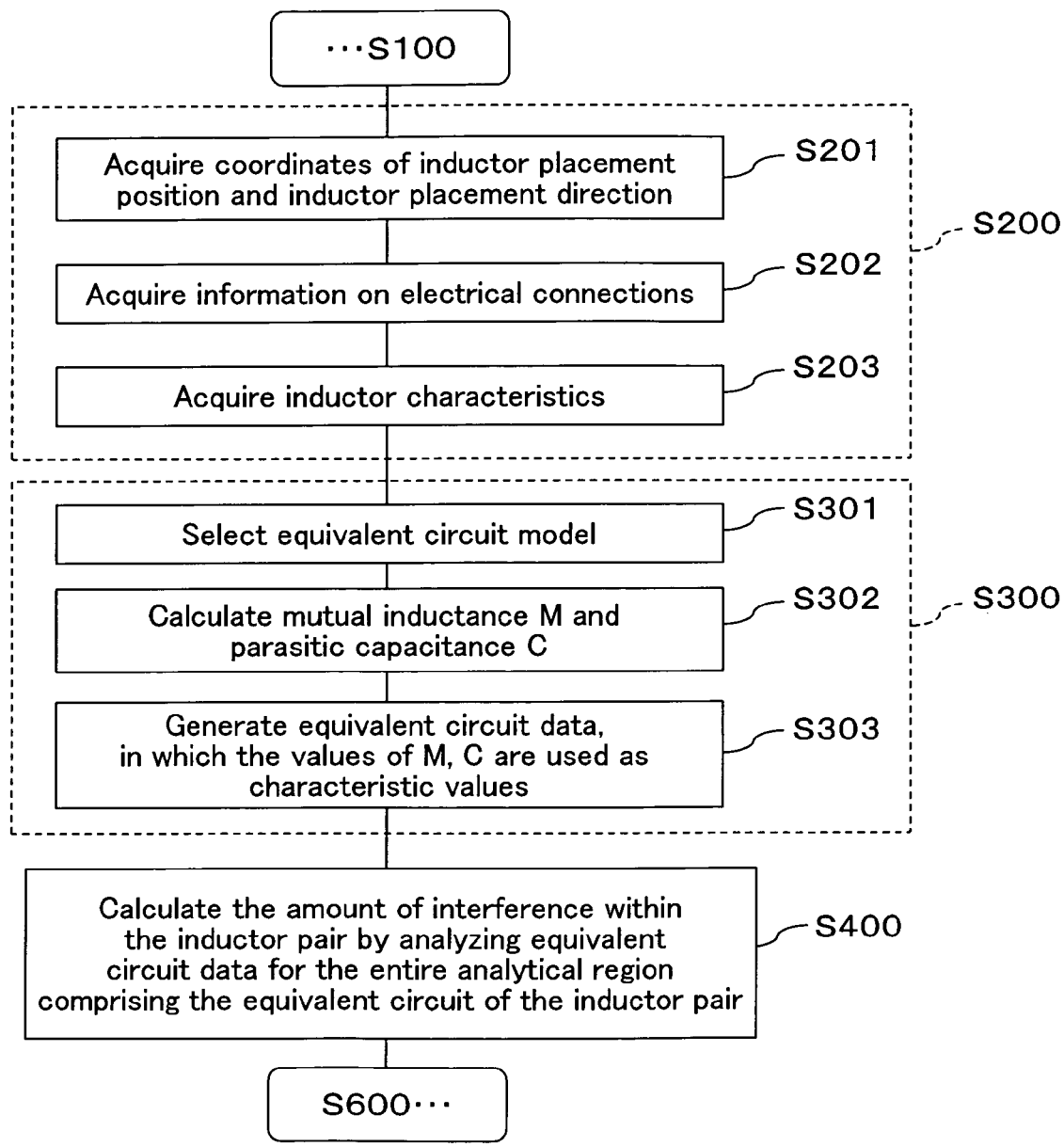
FIG. 9 is a flow chart illustrating an example of a detailed process flow of inductor information acquisition (S200) and substitution of equivalent circuits (S300).

Here, detailed explanations will be provided regarding processing involved in inductor information acquisition (S200) and substitution of equivalent circuits (S300). FIG. 9 is a flow chart illustrating an example of a detailed process flow of inductor information acquisition (S200) and substitution of equivalent circuits (S300).

During inductor information acquisition (S200), the substitution section 213 acquires element data 28 concerning each respective inductor in the inductor pairs selected by the selection section 211 from the design data 25 recorded in the storing section 212.

First of all, the substitution section 213 acquires information concerning the coordinates of the locations where the inductors are placed and information representing the orientation of the inductors (S201). The substitution section 213 acquires coordinates 81 and direction of placement 82 from the respective element data 28 concerning the inductor pairs selected by the selection section 211 included in the element data 28 for each of the inductors recorded in the storing section 212. The coordinates 81 are expressed, for instance, as X-Y coordinates. The direction of placement 82 of the inductors is represented by an angle with respect to a reference line drawn in the direction of the magnetic field generated by the inductors.

The substitution section 213 acquires connection information 83 from the respective element data 28 concerning the inductor pairs selected by the selection section 211 (S202). The connection information 83 is, for instance, information describing whether the terminals of the inductors are connected to a land or whether they are connected to ground.

The substitution section 213 acquires element characteristics 84 from the respective element data 28 concerning the inductor pairs selected by the selection section 211 (S203). The element characteristics 84 include, for instance, the inductance value, pitch, number of turns n, loop area $S_L$, winding axis direction, magnetic field direction, etc.

In addition to the above, information that the substitution section 213 may acquire from the element data 28 includes, for instance, flags (coherence-indicating flags) indicating the presence/absence of coherence in the elements, information concerning the structure of the elements (for instance, changes in properties caused by the dependency of the generated electromagnetic field on the orientation of the components, etc.), etc.

Next, the substitution section 213 generates equivalent circuit data representing electromagnetic coupling within the inductor pairs selected by the selection section 211 (S300). First of all, the substitution section 213 acquires the most appropriate equivalent circuit model from among the equivalent circuit models 23 recorded in the storing section 212 (S301).

The equivalent circuit models 23 are made up of data representing the configuration of equivalent circuits obtained when electromagnetic coupling within pairs of circuit elements is represented using equivalent circuits. Because equivalent circuits representing electromagnetic coupling within pairs vary depending on the type of circuit elements that make up the pairs, it is preferable for equivalent circuit models to be recorded for each type of circuit elements making up the pairs. The equivalent circuit models may include, for instance, equivalent circuit models for pairs obtained when two inductors make up a pair of circuit elements (L-L models), equivalent circuit models obtained when an inductor and a capacitor make up a pair of circuit elements (L-C models), or equivalent circuit models obtained when two capacitors make up a pair of circuit elements (C-C models), etc.

FIG. 10A is circuit diagram representing an example of an inductor pair. In the example illustrated in FIG. 10A, the inductor 40(L1) and inductor 40(L2) are spaced apart. One terminal of the inductor 40(L1) is connected to ground 30 and the other terminal is connected to a land 20. One terminal of the inductor 40(L2) also is connected to ground 30 and the other terminal is connected to a land 20. The self-inductance of the inductor 40(L1) is designated as L1 and the self-inductance of the inductor 40(L2) is designated as L2.

For instance, if mutual inductance between the inductor 40(L1) and the inductor 40(L2) is represented by M, then an equivalent circuit representing electromagnetic coupling between the inductor 40(L1) and the inductor 40(L2) will be as shown in FIG. 10B. Here, the symbol "C" represents mutual capacitance. Mutual capacitance C is generated by capacitive components due to the lands and electrodes of the inductors 40(L1) and 40(L2). Mutual capacitance is called parasitic capacitance. Examples of structures generating mutual capacitance C in inductor pairs will be described later.

Equivalent circuit models (L-L models) included in the equivalent circuit models 23 are made up of data representing, for instance, equivalent circuits such as the one illustrated in FIG. 10B. In the present embodiment, equivalent circuit models (L-L) representing electromagnetic coupling in inductor pairs, e.g. such as the one illustrated in FIG. 10B, are acquired by the substitution section 213 from the storing section 212.

The substitution section 213 calculates values representing the characteristics of the equivalent circuits represented by the equivalent circuit models acquired in S301 (S302). The values representing the characteristics of the equivalent circuits are, for instance, the characteristic values etc. of the circuit elements forming part of the equivalent circuits. In the example of the equivalent circuit illustrated in FIG. 10B, the characteristics are L1-M, L2-M, and C.

For instance, mutual inductance M in FIG. 10B is calculated using the following (Expression 2).

$$M = \alpha \cdot D^a \cdot S_L \cdot n \cdot t \cdot \mu 0 \cdot \mu s \quad \text{(Expression 2)}$$

In the above (Expression 2), $\alpha$ is a proportionality coefficient. D represents the inter-center distance between components, "a" is a coefficient, SL a loop area, n the number of turns in the inductors, t a coefficient (+, −, or 0) dependent on the mounting direction or winding direction of the inductors, $\mu 0$ magnetic permeability of vacuum, and $\mu s$ relative magnetic permeability. The proportionality coefficient $\alpha$ can be determined, for instance, from the pitch, device structure, etc. acquired by the substitution section 213 from the element data 28. The inter-center distance D can be determined from the coordinates 81 of the inductor pairs acquired by the substitution section 213 in S201. Information included in the element characteristics 84 acquired by the substitution section 213 in S203 can be used for $S_L$ and n. Coefficients recorded in the storing section 212 in advance can be used as the proportionality coefficient $\alpha$ and coefficient a.

The coefficient t can be determined from the winding axis direction, magnetic field direction, etc. included in the direction of placement 82 and element characteristics 84. For instance, t is set to +1 when the direction of the magnetic field generated by the inductor 40(L1) is parallel and oriented identically to the direction of the magnetic field generated by the inductor 40(L2), to −1 when the orientation is parallel and opposite thereto, and, if it is neither, t is set to 0.

Moreover, the substitution section 213 may use the above-mentioned coherence-indicating flags acquired from the element data 28 for the calculation of mutual inductance M. The coherence-indicating flags contain information, e.g. 1 or 0, set up according to the inductance. For instance, when either of the flags of an inductor pair is 0, the substitution section 213 sets mutual inductance M to 0, and when both flags of the inductor pair are 1, it can calculate mutual inductance M from the above (Expression 2).

On the other hand, mutual capacitance C in FIG. 10B can be calculated, for instance, from the following (Expression 3).

$$C = \beta \cdot \in 0 \cdot \in r \cdot S_C / L \quad \text{(Expression 3)}$$

In the above (Expression 3), $\beta$ is a proportionality coefficient, $\in 0$ the dielectric permittivity of vacuum, $\in r$ the relative dielectric permittivity (1.0 in case of air), $S_C$ the area between counter electrodes, and L the inter-center distance between the components. It is preferable for $\beta$, $\in 0$, and $\in r$ to be recorded in the storing section 212 in advance. $S_C$ can be determined from the element characteristics 84 and coordinates 81 acquired by the substitution section 213 in S201.

Moreover, the values of the coefficients $\alpha$, a, $\beta$, $\in 0$, and $\in r$ can be inputted by the user directly, for instance, through the user interface 230.

If mutual inductance M and mutual capacitance C are determined as described above, L1-M, L2-M, and C, i.e. the characteristic values of the equivalent circuit illustrated in FIG. 10B, are obtained as well. The substitution section 213 generates equivalent circuit data representing electromagnetic coupling within the inductor pairs selected by the selection section 211 through the addition of the characteristic values (L1-M, L2-M, and C) calculated in S302 to the equivalent circuit model representing the equivalent circuit illustrated in FIG. 10B (S303).

Equivalent circuit data is data that is described, for instance, in the form of a netlist. FIG. 10C illustrates an example of a netlist representing the equivalent circuit illustrated in FIG. 10B. In the example of the netlist illustrated in FIG. 10C, ".SUBCKT" in the first line represents the beginning of a sub-circuit definition, "sample" is a sub-circuit name, and "N1", "N2", "N3", and "N4" represent the names of nodes used for outside connections. The second line shows that an inductor "L1" is connected between the nodes "N1" and "N3", and that the inductance of the inductor "L1" is "$1.5013 \times 10^{-07}$". The third line shows that an inductor "L2" is connected between the nodes "N2" and "N4", and that the inductance of the inductor "L2" is "$1.0034 \times 10^{-07}$". The fourth line represents mutual inductance. In the equivalent circuit, mutual inductance is computed, for instance, as a parameter defined by a coupling coefficient K, based on the following (Expression 4).

$$K = M/\sqrt{(L1 \cdot L2)} \quad \text{(Expression 4)}$$

The fifth line shows that a capacitor "C12" is connected between the nodes "N1" and "N3" and that the capacitance of the capacitor "C12" is "$1.53 \times 10^{-12}$".

The substitution section 213 performs the processing of the above-mentioned S201 to 203 and S301 to S303 for all the inductor pairs selected by the selection section 211. As a result, equivalent circuit data representing respective electromagnetic coupling is obtained for all the inductor pairs selected by the selection section 211.

The substitution section 213 combines these equivalent circuit data with the circuit data 26 representing equivalent circuits for all the circuits formed in the analytical region 50. For instance, the substitution section 213 adds the netlist of the equivalent circuit data to the netlist of the circuit data 26. Specifically, the netlist that represents the equivalent circuit of FIG. 10B is added to the circuit data 26 between the terminal 20 connected to the land of the inductor 40(L2) and the terminal connected to the land 20 of the inductor 40(L1) of FIG. 10A.

Therefore, the circuit data 26 now represents equivalent circuits for the entire analytical region, including equivalent circuits representing electromagnetic coupling within the inductor pairs selected by the selection section 211. As a result, the obtained circuit data 26 represent all the equivalent circuits subject to analysis, including equivalent circuits for the inductor pairs generated in S300.

The analysis section 214 obtains the amount of interference in the inductor pairs by analyzing circuit data 26 representing equivalent circuits for the entire analytical region including the equivalent circuits for the inductor pairs generated by the substitution section 213 in S300 (S400). A well-known circuit simulator, e.g. such as SPICE (Simulation Program with Integrated Circuit Emphasis), can be used for the analysis of equivalent circuits. Data representing the amount of coupling in inductor pairs, e.g. such as impedance, isolation, or the S parameter, etc. within the inductor pairs, is obtained as a result of the analysis. The amount of coupling within the inductor pairs represents the amount of interference within the inductor pairs.

As described above, the design system 200 of the present embodiment obtains the amount of interference between circuit elements by generating circuit data 26 representing all the equivalent circuits subject to analysis by replacing spatial electromagnetic coupling between circuit elements with equivalent circuits and adding the equivalent circuits to all the equivalent circuits subject to analysis, and then analyzing these circuit data using an existing circuit simulator etc. Therefore, the amount of interference between circuit elements is calculated through simpler processing than in the case of electromagnetic field analysis using finite element techniques, etc.

The assessment section 218 compares the amount of interference obtained in S400 with a pre-configured permissible limit of interference and displays the results in the output section 215, e.g. on a screen such as the one illustrated in FIG. 8. Because the design system 200 can display the pairs of inductors 40, whose analysis shows them to be faulty in terms of electromagnetic interference, checking for electromagnetic interference between inductors, which had to be done visually by skilled designers in the past, can now be done substantially automatically.

The design data 25 subsequently is corrected such that the inductor pairs whose analysis shows them to be faulty in terms of electromagnetic interference are restored to appropriate condition by the user by modifying their placement via the user interface 230 using the input device 105 of the design system 200. The user also may perform a check again using the same method after correction.

Figure 11:
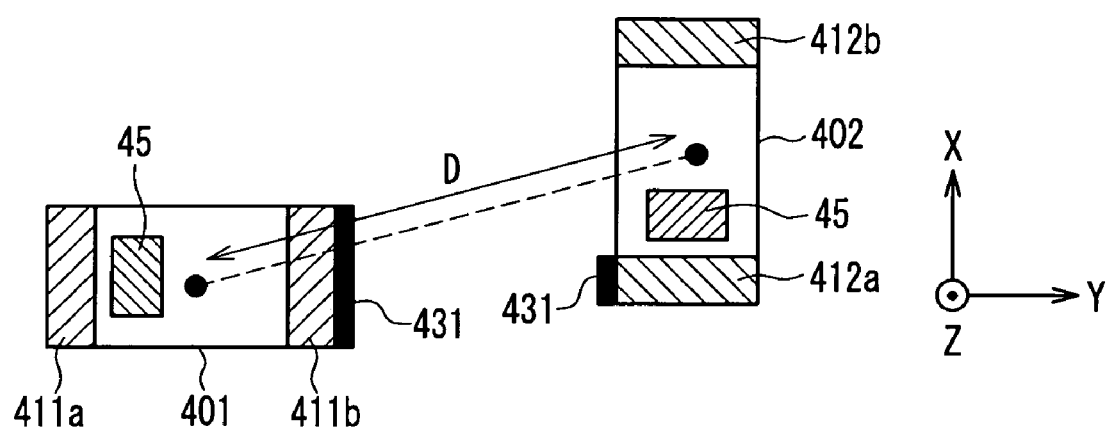
FIG. 11 illustrates an example of the placement of an inductor pair that may result in electromagnetic interference.

Here, explanations are provided regarding an example of an inductor pair structure that generates mutual capacitance. FIG. 11 illustrates an example of placement of an inductor pair that may result in electromagnetic interference. FIG. 11 illustrates a case in which the board (not shown) on which the inductors are placed, is located in the XY plane, with the two inductors viewed in the direction of the Z-axis. The two inductors 401 and 402 illustrated in FIG. 11 are, respectively, chip inductors. The chip inductors 401, 402 are placed such that the longitudinal direction of the chip inductor 401 and the longitudinal direction of the chip inductor 402 are orthogonal to each other. The chip inductor 401 has two electrode terminals, 411a and 411b, and the chip inductor 402 has two electrode terminals, 412a and 412b. The chip inductors 401, 402 are marked with markers 45 to indicate the direction of the magnetic field. If the distance between the center of the chip inductor 401 and the center of the chip inductor 402 is designated as D (inter-center distance), then the larger D becomes, the more unlikely it is for electromagnetic interference to be generated. The portion 431 of the electrode terminal 411b of the chip inductor 401, which faces the chip inductor 402, and the portion 432 of the electrode terminal 412a of the chip inductor 402, which faces the chip inductor 401, are positioned in a mutually facing relationship. The mutually opposite portions, i.e. portion 431 of the electrode terminal 411b and portion 432 of the electrode terminal 412a, are counter-electrode portions. The counter electrode portions constitute the main factor of mutual capacitance C (parasitic capacitance).

Figure 12A:
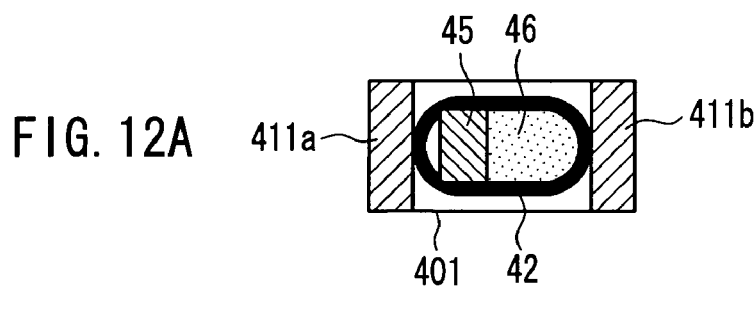
FIG. 12A is a top perspective view, in which the chip inductor 401 is viewed in the direction of the Z-axis.
Figure 12B:
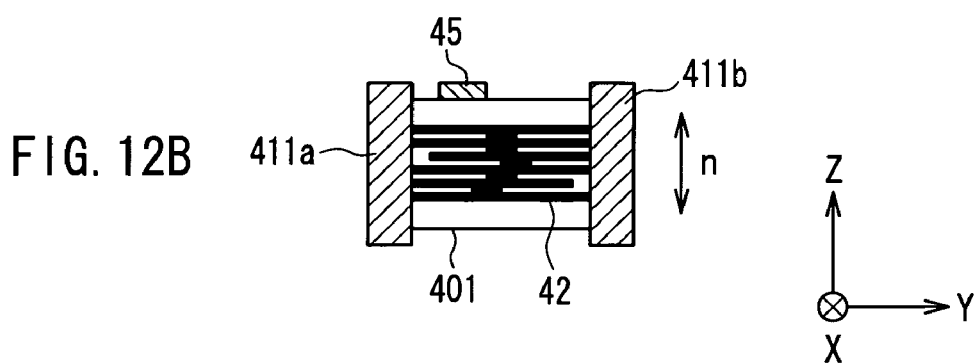
FIG. 12B is a lateral perspective view, in which the chip inductor 401 is viewed in the direction of the X-axis.

The chip inductors 401 and 402 are, for instance, layered chip inductors. FIG. 12 illustrates the internal structure of a layered chip inductor. FIG. 12A is a top perspective view, in which the chip inductor 401 is viewed in the direction of the Z axis, and FIG. 12B is a lateral perspective view, in which the chip inductor 401 is viewed in the direction of the X axis. The number of turns in the inner electrode 42 is n, and the area enclosed by the internal electrode 42 in a cross-section parallel to the X-Y plane is the loop area $S_L$.

Figure 13A:
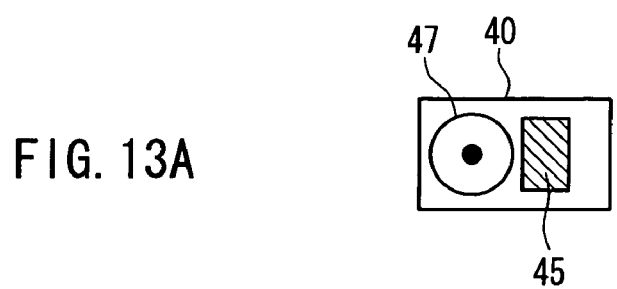
FIG. 13A is a diagram representing the direction of the magnetic field in the chip inductor 401 viewed in the direction of the Z-axis.
Figure 13B:
FIG. 13B is a diagram representing the direction of the magnetic field in the chip inductor 401 viewed in the direction of the X-axis.

The inner electrode 42 of the chip inductor 401 is formed in a spiral shape centered on the normal direction to the board, where the chip inductor 401 is provided (in an orthogonal direction to the board, i.e. in the direction of the Z axis). Therefore, the direction of the magnetic field 47 of the chip inductor 40 coincides with the orthogonal direction relative to the board, that is, the direction of the Z axis. FIG. 13A represents the direction of the magnetic field 47 in the chip inductor 401 viewed in the direction of the Z-axis. FIG. 13B represents the direction of the magnetic field 47 in the chip inductor 401 viewed in the direction of the X-axis. As illustrated in FIG. 13A and FIG. 13B, the direction of the magnetic field 47 of the chip inductor 401 coincides with the orthogonal direction relative to the board. In general, the winding direction of the chip inductors placed on the same board is the same. Therefore, the direction of the magnetic field 47 of the chip inductors placed on the same board is either orthogonal to the surface of the board and directed upwards, or orthogonal thereto and directed downwards. As a rule, on the same board, all the chip inductors are placed such that the direction of the magnetic field is oriented upwards from the board; otherwise, all the chip inductors are placed such that the direction of the magnetic field is oriented downwards from the board.

As described above, inductors mounted to a circuit board typically have the same winding direction. Therefore, it is also possible to use a system in which the substitution section 213 does not acquire or calculate information representing the winding direction of the inductors subject to analysis for each inductor and all the inductors are processed as inductors having the same winding direction. Moreover, when the inductors subject to interference analysis are chip inductors, processing can be set up by having the substitution section 213 automatically specify the direction of the magnetic field of the inductors.

According to the design system 200 of the present embodiment, after selecting an inductor pair 40 subject to interference analysis, an equivalent circuit is substituted for the circuit comprising the inductor pair based on information concerning the inductors recorded in the storing section 212, and next, interference analysis is carried out with respect to said equivalent circuit. Consequently, circuit board design that accounts for electromagnetic interaction between inductors is made possible. In other words, inductors can be checked for electromagnetic interaction automatically. Therefore, CAD-based circuit design can be carried out more smoothly.

Specifically, the following effects can be obtained. Namely, conventional checking, which was based on the know-how of skilled designers, was performed visually. As a result, things tended to be overlooked very easily for various reasons. Put differently, it was difficult to achieve a zero error rate. Because the design method of the present embodiment permits automation using the design system 200, the incidence of mistakes during visual checking can be decreased. In particular, if the results are displayed on the display device 107 in an easily understandable form and if the system is set up to issue warnings, the incidence of mistakes can be reduced substantially to zero.

Moreover, the problem with conventional visual checking techniques was that the number of operations during checking dramatically increased, and, therefore, the probability of errors rose when design patterns became more complex. Because in the design method of the present embodiment checking is performed by the computer 110, which constitutes the design system 200, there is basically no workload for the user and the processing time required for checking is dependent only on the processing power of the computer 110.

Moreover, one might want to design electronic equipment with reduced spacing between components in order to achieve miniaturization. Because the influence of electromagnetic interference between circuit elements such as inductors has not been considered in the past, even though miniaturization could be accomplished by simply narrowing the spacing between circuit elements, the desired characteristics were not obtained as a result of the electromagnetic interference between circuit elements. On the other hand, because the design system 200 of the present embodiment enables design that accounts for electromagnetic interference between circuit elements, it becomes easy to obtain the desired characteristics while achieving miniaturization of products (for instance, circuit board substrates, and, consequently, electronic equipment).

In addition, in the past, defects generated under the influence of electromagnetic interference between inductors were revealed only during prototype fabrication after the design of a printed circuit board was complete. Therefore, measures had to be taken to eliminate defects every time a prototype was fabricated, and cost increases due to increased prototype fabrication frequency presented a problem. On the other hand, in design based on the design system 200 of the present embodiment, the problem of such cost increases can be eliminated because it is now possible to carry out design that accounts for the influence of electromagnetic interference between inductors.

Examples of Modified Analysis Objects

Next, explanations regarding modified examples of circuit boards represented by design data, subject to analysis by the design system 200, are provided with reference to FIG. 14 through FIG. 19. In the above-described embodiment, electromagnetic interference between inductors was checked in the planar domain, but the configuration of circuit boards subject to analysis is not limited thereto, and, for instance, in addition to the planar domain (two-dimensional domain), electromagnetic interference between inductors can be checked in the volumetric domain (three-dimensional domain) as well.

It should be noted that since the modification examples described below represent modifications and further development of the above-described embodiment, the explanations below are focused mainly on the feature content of the respective modified examples. Explanations regarding content identical to the above-described embodiment have been omitted.

The demand for high-density packaging of electronic components mounted to circuit boards and for improved functionality of circuit boards populated by electronic components has been growing steadily in recent years as electronic equipment continues to become smaller, thinner, etc. In such a situation, boards with built-in components have been developed, in which electronic components are embedded into the boards. Because in boards with embedded components passive components (for instance, inductors and capacitors) and active components (for instance, semiconductor devices) are embedded into the board, the surface area of the board can be reduced. Moreover, because the number of degrees of freedom for electronic components is higher in comparison with surface mounting, improvements in high frequency characteristics etc. can be expected as a result of optimizing wiring between electronic components.

However, when skilled designers checked for electromagnetic interference between inductors based on their know-how, they tended to overlook the influence of electromagnetic interference between inductors located in the same plane. Because in boards with embedded components inductors are placed in a three-dimensional manner, checking for the influence of electromagnetic interference between inductors is more difficult. Also, in some cases, checking based on the know-how of a skilled designer may be ineffective in the case of circuit design diagrams obtained by translating boards with embedded components into two-dimensional representations.

According to the circuit board design system 200 of the present embodiment, in the inductor pair selection step (S100) in the flow chart illustrated in FIG. 4, inductors existing in the three-dimensional domain can be selected in addition to those in the two-dimensional domain. Therefore, the design system 200 also can be applied suitably to the design of circuit boards with embedded components.

Figure 14:
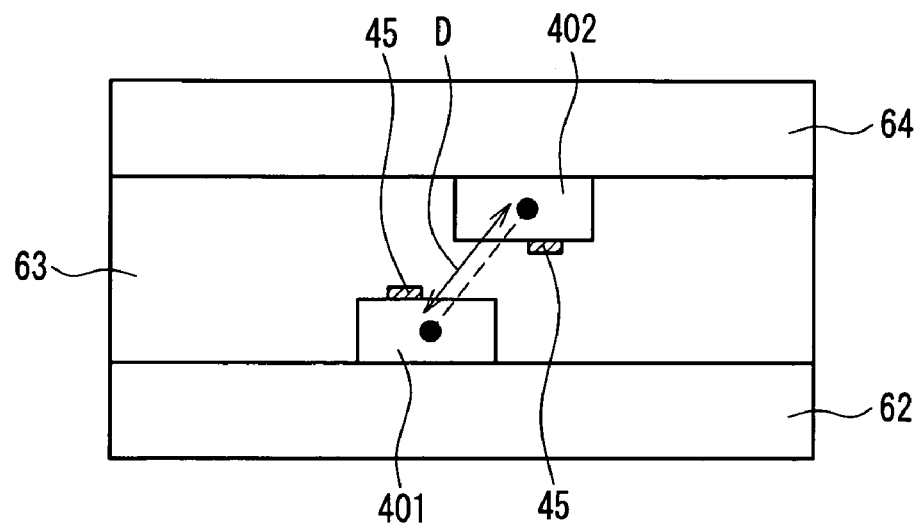
FIG. 14 is a cross-sectional view illustrating an example of a board with embedded components containing built-in inductors.

FIG. 14 is a sectional view illustrating an example of a board with embedded components containing built-in inductors. The design system 200 can be used for checking for electromagnetic interference between the inductors 401, 402 in boards with embedded components such as the one illustrated in FIG. 14. The board with embedded components illustrated in FIG. 14 is made up of a bottom substrate 62, a top substrate 64, and a component embedding layer 63 located between the bottom substrate 62 and the top substrate 64. An inductor 401 is mounted to the bottom substrate 62 and embedded in the component embedding layer 63. An inductor 402 is formed such that it is mounted to the top substrate 64 and embedded in the component embedding layer 63. The component embedding layer 63 is made, for instance, from a composite material etc. containing an inorganic filler and a resin.

Element data 28, which represents the inductors 401, 402 illustrated in FIG. 14, preferably includes information concerning three-dimensional coordinates representing the locations of the inductors 401, 402 on the board with embedded components. The three-dimensional coordinates may be absolute coordinates or relative coordinates. The substitution section 213 performs calculations to compute the inter-center distance D based on the respective three-dimensional coordinates of the inductors 401, 402. This computational processing readily can be executed by the computer 110, which includes a CPU 101. The mutual inductance and mutual capacitance between the inductor 401 and the inductor 402 can be obtained as described above using information concerning the inductors 401, 402, including the inter-center distance D. Using these values, equivalent circuit data representing electromagnetic coupling between the inductors 401, 402 are calculated in the substitution section 213. The analysis section checks for electromagnetic interference between the inductors 401, 402 by analyzing equivalent circuits for the entire board with embedded components, including the above-mentioned equivalent circuit data. By doing so, the user can confirm the presence of electromagnetic interference between inductors before prototype fabrication.

Figure 15:
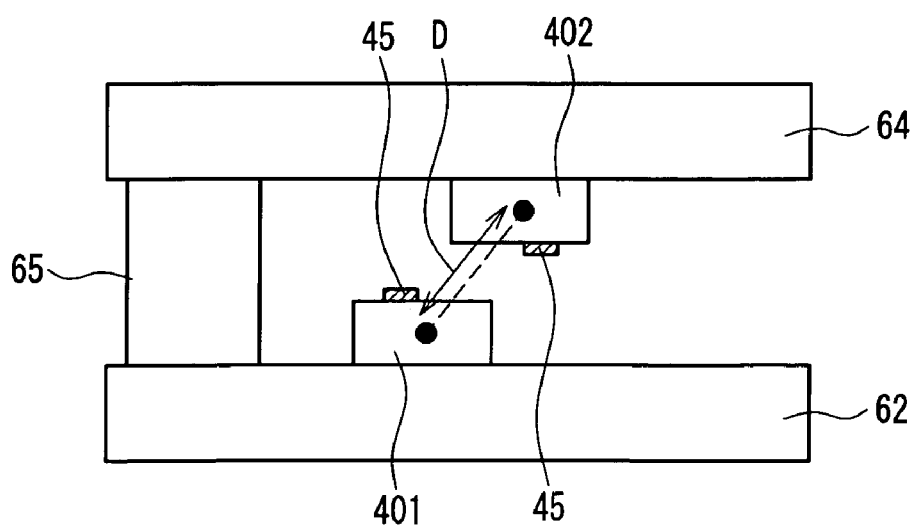
FIG. 15 is a diagram illustrating an example of a multi-layer circuit board module.

Moreover, the design system 200 of the present embodiment is not limited to boards with embedded components, and also can analyze design data representing multi-layer circuit board modules such as the one illustrated in FIG. 15. The multi-layer circuit board module illustrated in FIG. 15 comprises a bottom substrate 62 and a top substrate 64 interconnected by a connector 65. An inductor 401 is mounted to the bottom substrate 62 and an inductor 402 is mounted to the top substrate 64, respectively.

Figure 16:
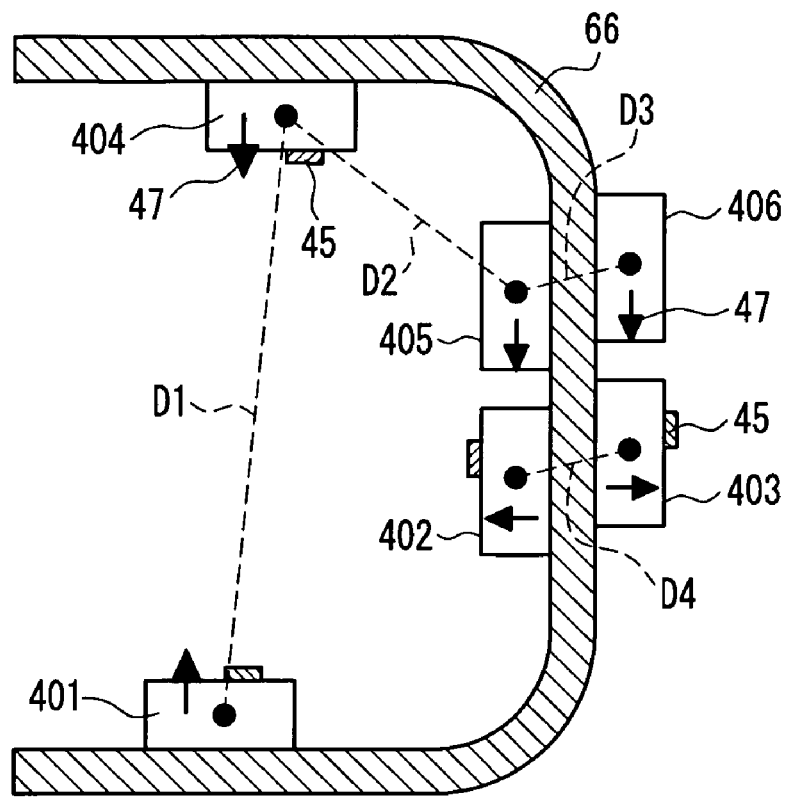
FIG. 16 is a diagram illustrating an example of a bendable flexible board with inductors mounted thereto.

In addition, the design system 200 of the present embodiment can analyze design data representing a bendable flexible board 66 with inductors mounted thereto, for instance, such as the one illustrated in FIG. 16. Layered chip inductors 401 to 404 and winding-structure inductors 405, 406 are mounted to the flexible board 66 illustrated in FIG. 16. In the layered chip inductors 401 to 404, the direction of the magnetic field 47 is roughly orthogonal to the flexible board 66. In the layered chip inductors 401 to 404, the direction of the magnetic field 47 is roughly orthogonal to the flexible board 66. The design system 200 can carry out interference analysis by calculating the distance D1 between the center of the inductor 401 and the center of the inductor 404, the distance D2 between the center of the inductor 404 and the center of the inductor 405, the distance D3 between the center of the inductor 405 and the center of the inductor 406, and the distance D4 between the center of the inductor 402 and the center of the inductor 403.

As shown in the example illustrated in FIG. 16, even when inductors of dissimilar types are mounted to the board, information representing the direction of the magnetic field 47 of all the inductors 401 to 406 is recorded in the element data 28 of the design data 25, and therefore the substitution section 213 can acquire information representing the direction of the magnetic field 47 of all the inductors 401 to 406 from the element data 28 and use it to check for electromagnetic interference between the inductors 40. It should be noted that although the flexible board 66 illustrated in FIG. 16 is a multi-layer flexible board with inductors mounted to both sides, flexible boards with inductors mounted to only one of the sides can be checked for interference as well.

Figure 17:
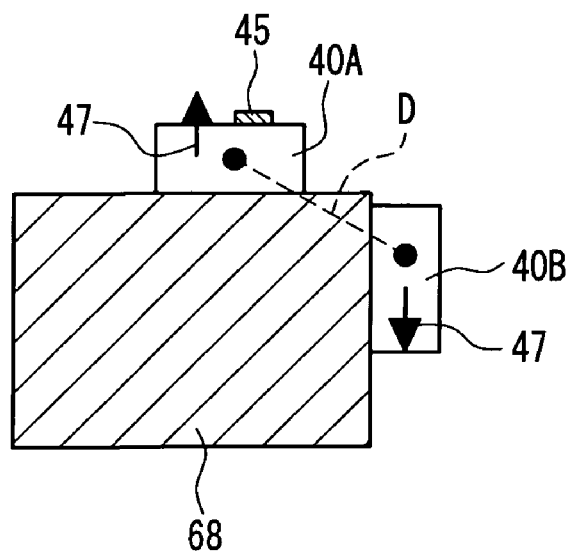
FIG. 17 illustrates an example of an MID (Molded Interconnect Device) board.

Additionally, the design system 200 can analyze even design data representing embodiments, in which inductors 40(40A, 40B) are mounted to a MID (Molded Interconnect Devices) board 68 (microwave circuit board), such as the one illustrated in FIG. 17.

Figure 18:
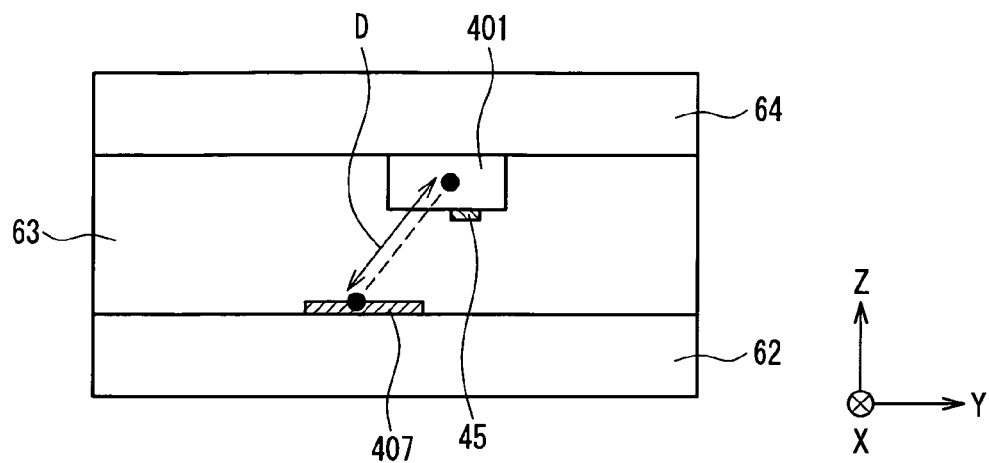
FIG. 18 illustrates an example of a board containing a spiral inductor 407.
Figure 19:
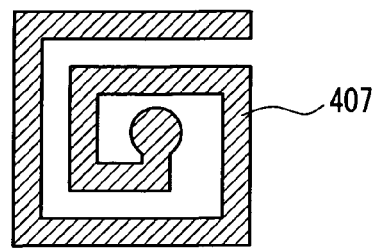
FIG. 19 illustrates the top face configuration of the spiral inductor 407 viewed in the direction of the Z-axis.

Furthermore, a spiral inductor 407, such as the one illustrated in FIG. 18, may be included in the design data 25 subject to analysis. The spiral inductor 407 is a pattern component (pattern element) made up of wiring. FIG. 19 illustrates the top face configuration of the spiral inductor 407 illustrated in FIG. 18, viewed in the direction of the Z-axis.

In the example illustrated in FIG. 18, a chip inductor 401 and a spiral inductor 407 are embedded into the component embedding layer 63 of a board with embedded components. In this configuration example, the system also can perform calculations to compute the distance D between the center of the chip inductor 401 and the center of the spiral inductor 407 and check for electromagnetic interference using the distance D and other data.

The circuit board design system 200 described in the embodiments of the present invention offers superior convenience because it is capable of automatically checking for electromagnetic interaction between inductors even in case of three-dimensional design data for circuit boards such as boards with embedded components, multilayer substrate modules, bendable flexible boards, MID boards (microwave circuit boards), etc.

It should be noted that the design data 25 subject to analysis by the design system 200 may include data representing circuit substrates used for semiconductor integrated circuits.

EMBODIMENT 2

Figure 20:
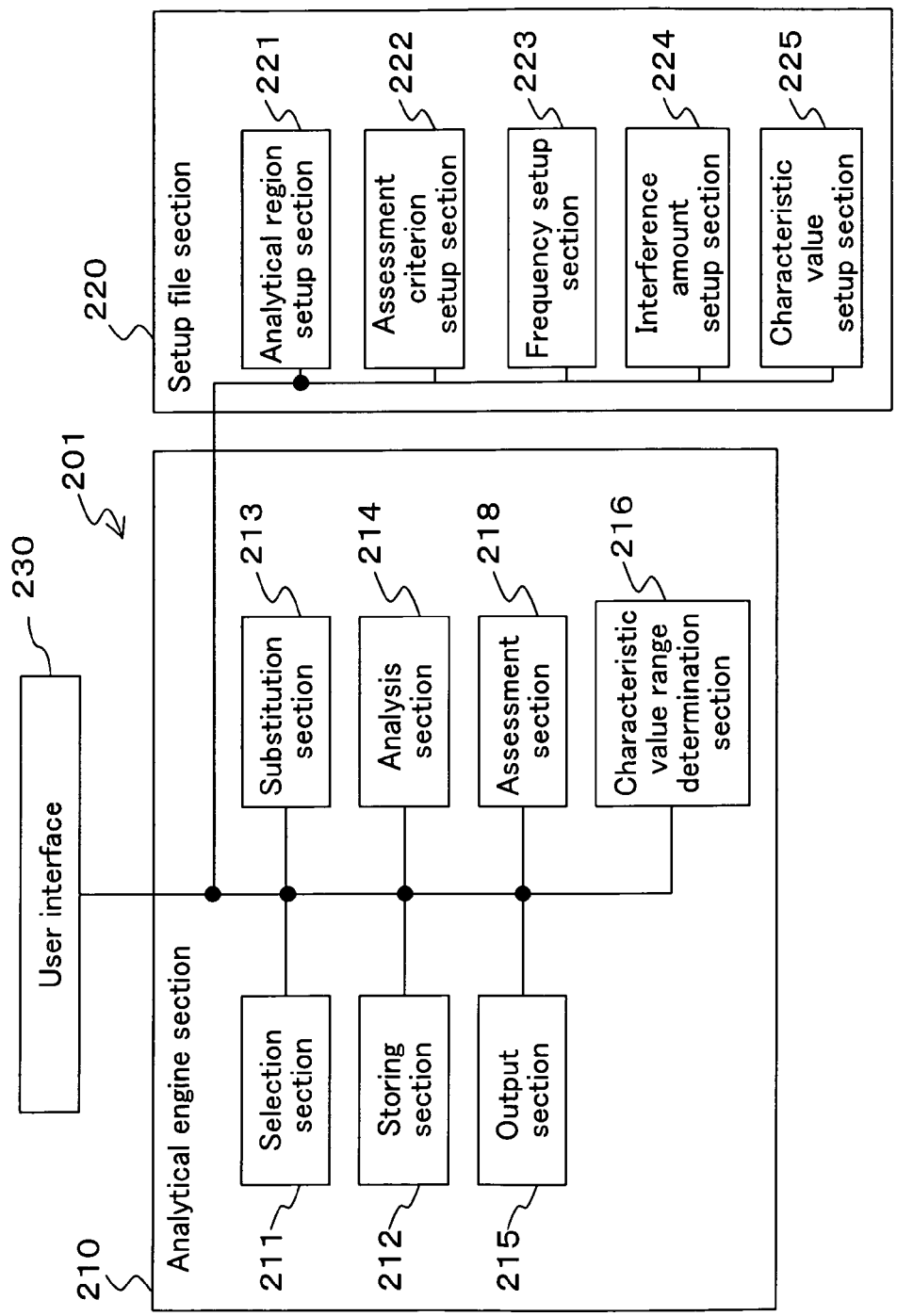
FIG. 20 is a functional block diagram representing the configuration of the design system 201.

FIG. 20 is a functional block diagram representing the configuration of the design system 201 used in Embodiment 2. In the design system 201 illustrated in FIG. 20, the same numbers are assigned to components identical to those of the design system 200 illustrated in FIG. 1, and their explanation is omitted.

The setup file section 220 of the design system 201 further comprises a frequency setup section 223, an interference amount setup section 224, and a characteristic value setup section 225. Also, the analytical engine section 210 further comprises a characteristic value range determination section 216.

The frequency range that requires analysis is recorded by the frequency setup section 223 in the setup file section 220. The frequency range that requires analysis is input by the user, e.g. through the user interface 230.

Data representing the range of the amount of interference between circuit elements that needs to be considered during analytical processing is recorded by the interference amount setup section 224 in the setup file section 220. For instance, the range of the amount of interference is represented as an impedance range. Data representing the range of the amount of interference between circuit elements is inputted by the user e.g. through the user interface 230.

The characteristic value range determination section 216 generates data representing a range of characteristic values for equivalent circuits representing electromagnetic coupling between the above-mentioned circuit elements using data representing interference amount ranges and data representing frequency ranges recorded in the setup file section 220. Data representing characteristic value ranges generated by the characteristic value range determination section 216 is recorded in the setup file section 220 by the characteristic value setup section 225. Based on the characteristic value ranges recorded in the setup file section 220, the substitution section 213 generates equivalent circuit data.

It should be noted that the characteristic value setup section 225 may set up data representing characteristic value ranges, inputted by the user through the user interface 230, in the setup file section 220. For instance, it is preferable for the user to be able to specify, through the user interface 230, whether the substitution section 213 should use characteristic value ranges input by the user or characteristic value ranges calculated by the characteristic value range determination section 216.

Figures 21A, 21B:
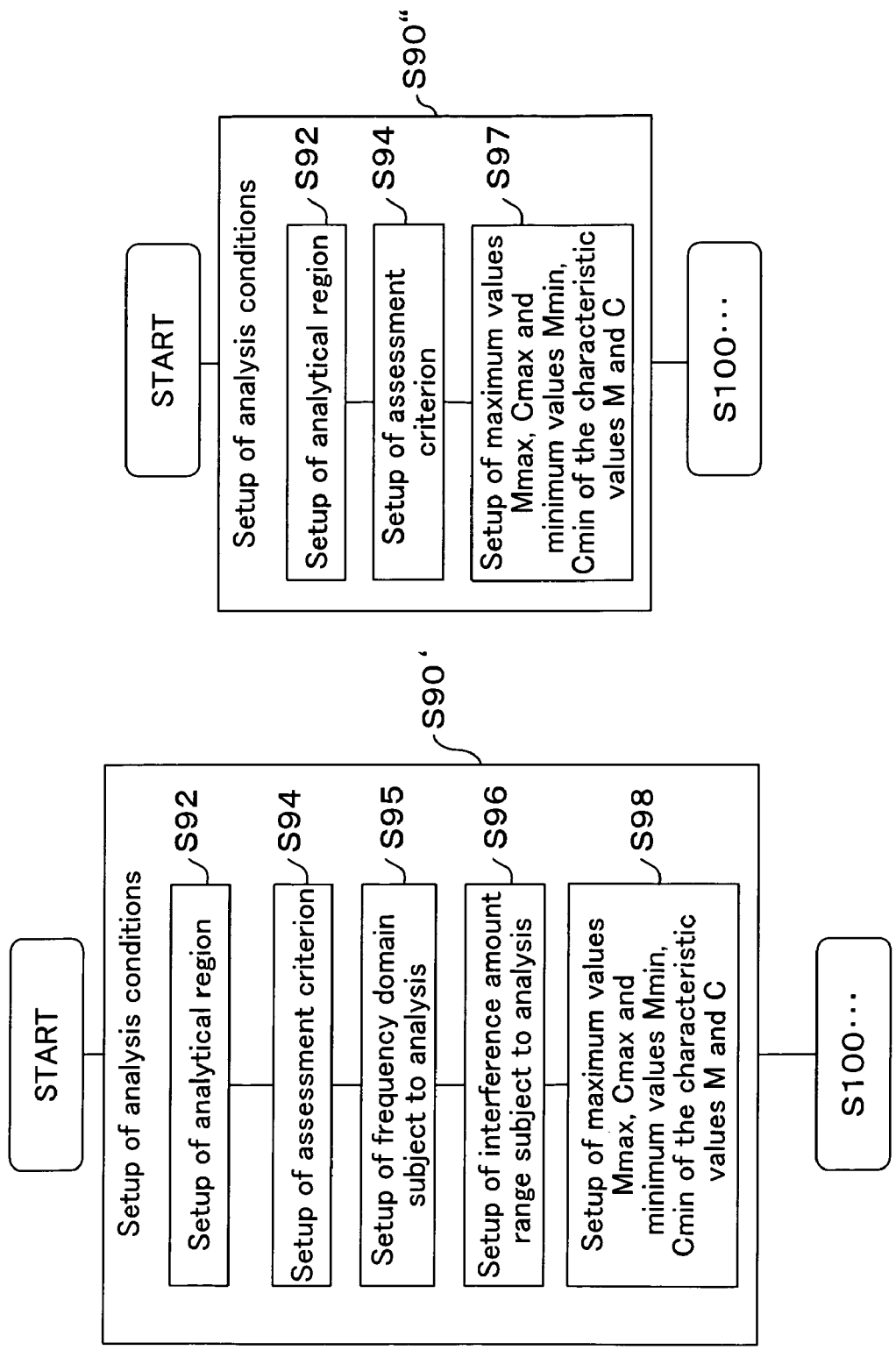
FIG. 21A is a flow chart illustrating analysis condition setup processing (S90) that takes place during interference analysis processing carried out by the design system 201.
FIG. 21B is a flow chart illustrating analysis condition setup processing (S90) that takes place upon receipt of user's data input representing characteristic value ranges.

Next, explanations are provided regarding an example of operation of the design system 201 used in the present embodiment. FIG. 21A is a flow chart illustrating analysis condition setup processing (S90) that takes place during interference analysis processing performed by the design system 201. In the flow chart illustrated in FIG. 21A, the setup of the analytical region (S92), as well as the setup of the assessment criterion (S94), are similar to the processing of the flow chart illustrated in FIG. 4.

During the setup of the frequency domain subject to analysis (S95), the frequency setup section 223 acquires the maximum frequency and the minimum frequency in the frequency domain subject to analysis based on input from the user interface 230 and records them in the setup file section 220.

The maximum value and the minimum value of the amount of interference, i.e. the interference amount range that needs to be taken into consideration during interference analysis, is acquired by the interference amount setup section 224 from the user interface 230 and recorded in the setup file section 220 (S96). For instance, if the amount of interference between circuit elements exceeds the maximum value, then, during the interference analysis, it is concluded that there is a short circuit between the circuit elements. Moreover, when the amount of interference between circuit elements is smaller than the minimum value, it is concluded that there is no interference between the circuit elements.

The amount of interference between circuit elements can be defined, e.g. through impedance. In such a case, the maximum and minimum values of impedance define an impedance range that needs to be taken into consideration.

For instance, let us consider a case, in which the amount of interference within a pair of inductors 40(L1) and 40(L2) illustrated in FIG. 10A is defined by impedance. As described above, the substitution section 213 substitutes data represented by the equivalent circuit illustrated in FIG. 10B for electromagnetic coupling within the inductor pair shown in FIG. 10B. The impedance representing the amount of interference within the pair of inductors 40(L1) and 40(L2) can be calculated, for instance, from mutual inductance M and the frequency. When the impedance within the pair of inductors 40(L1) and 40(L2) is greater than the defined maximum value of impedance at the minimum frequency in the frequency domain subject to analysis, the substitution section 213 and analysis section 214 can assume that mutual inductance M has produced a short circuit. Moreover, when the impedance within the pair of inductors 40(L1) and 40(L2) is smaller than the defined minimum value of impedance at the maximum frequency in the frequency domain subject to analysis, it can be assumed that mutual inductance M has produced an open circuit.

Also, when the impedance within the pair of inductors 40(L1) and 40(L2) is smaller than the defined minimum value of impedance at the minimum frequency in the frequency domain subject to analysis, it can be assumed that mutual capacitance has produced a short circuit. When the impedance within the pair of inductors 40(L1) and 40(L2) is greater than the defined maximum value of impedance at the maximum frequency in the frequency domain subject to analysis, the situation can be handled by assuming that mutual inductance has produced an open circuit.

The characteristic value range determination section 216 obtains ranges of values representing the characteristics of the above-mentioned equivalent circuits that would be within the range of the maximum and minimum values of the amount of interference in the frequency domain under analysis. For example, the maximum and minimum values are obtained for the characteristic values of the circuit elements forming part of the above-mentioned equivalent circuits.

For instance, in the case of an equivalent circuit representing electromagnetic coupling between inductors, such as the one illustrated in FIG. 10B, the maximum value Mmax and the minimum value Mmin of mutual inductance M, as well as the maximum value Cmax and the minimum value Cmin of mutual capacitance C, are obtained as characteristic value ranges for the equivalent circuit. It is desirable for the respective maximum and minimum values of mutual inductance M and mutual capacitance C to be determined such that the amount of interference between inductors falls within the range set up by the interference amount setup section 224. For instance, these maximum and minimum values are determined, respectively, at various frequencies included in the frequency domain of the analytical region. At every frequency, the respective maximum values Mmax and Cmax and minimum values Mmin and Cmin of mutual inductance M and mutual capacitance C, at which the amount of interference falls within the range set up by the interference amount setup section 224, are determined as the final ranges.

For instance, let us consider a case in which the amount of interference between circuit elements is defined by the maximum and minimum values of impedance by the interference amount setup section 224. In this case, the characteristic value range determination section 216 can designate as Mmax the mutual inductance at which the impedance between circuit elements reaches the defined maximum value of impedance at the minimum frequency in the frequency domain subject to analysis, and also can designate as Mmin the mutual inductance at which the impedance between circuit elements reaches the defined minimum value of impedance at the maximum frequency in the frequency domain subject to analysis. Moreover, the characteristic value range determination section 216 can determine as Cmin the mutual capacitance at which the impedance between circuit elements reaches the defined minimum value of impedance at the minimum frequency in the frequency domain subject to analysis and, also can determine as Cmax the mutual capacitance at which the impedance between circuit elements reaches the defined maximum value of impedance at the maximum frequency in the frequency domain subject to analysis.

It should be noted that although the characteristic value range calculation (S98) in the processing illustrated in FIG. 21A is carried out based on data set up during frequency domain setup (S95) and interference amount range setup (S96), data representing characteristic value ranges can also be acquired from the user through the user interface 230. FIG. 21B is a flow chart illustrating analysis condition setup processing (S90) that takes place upon receipt of input of data representing a characteristic value range from the user. During characteristic value setup (S97), the maximum values Mmax and Cmax and minimum values Mmin and Cmin of mutual inductance M and mutual capacitance C of the equivalent circuit illustrated in FIG. 10B are acquired by the characteristic value setup section 225 from the user interface 230.

The characteristic value ranges of the equivalent circuit obtained as described above are recorded in the setup file section 220. It should be noted that although the frequency domain subject to analysis and the interference amount range subject to analysis shown in the flowchart illustrated in FIG. 21A referred to as an example in which data inputted via the user interface 230 were recorded in the setup file section 220, these data can be pre-recorded in the setup file section 220 or in the storing section 212 in advance. In the processing of FIG. 21B, data obtained as a result of input of data representing characteristic value ranges through the user interface 230 are recorded in the setup file section 220, but these data also can be pre-recorded in the setup file section 220 or in the storing section 212 in advance. In this manner, even if the frequency domain subject to analysis, the interference amount range subject to analysis, and the characteristic value ranges are not inputted through the user interface 230, the substitution section 213 can still perform the following processing.

Figure 22:
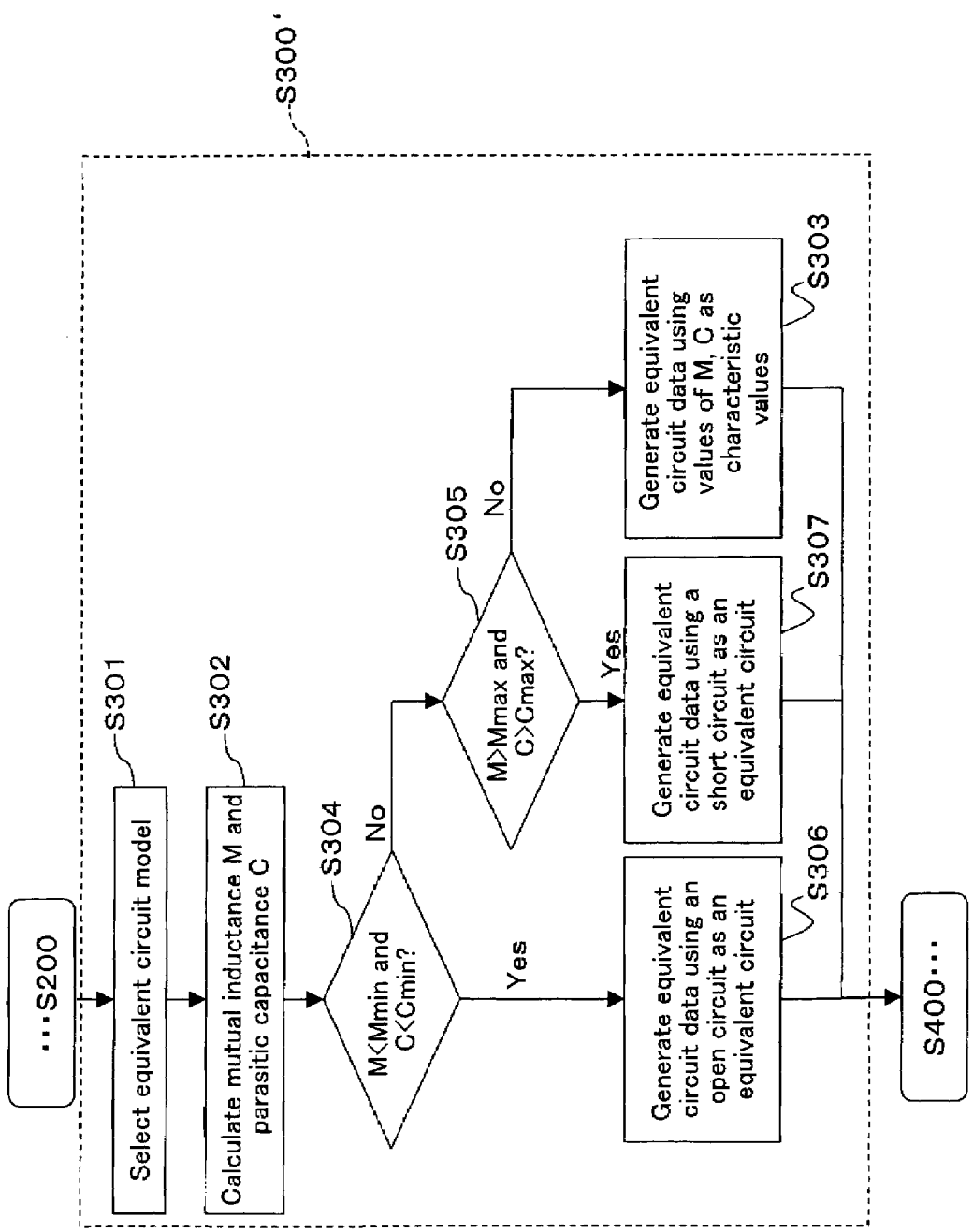
FIG. 22 is a flow chart illustrating an example of processing, whereby the substitution section 213 generates equivalent circuit data based on the maximum values $M_{max}$, $C_{max}$ and minimum values $M_{min}$, $C_{min}$ of the characteristic values M and C.

The substitution section 213 generates equivalent circuit databased on the characteristic value ranges. FIG. 22 is a flow chart illustrating an example of processing, whereby the substitution section 213 generates equivalent circuit databased on the maximum values $M_{max}$, $C_{max}$ and on the minimum values $M_{min}$, $C_{min}$ of the characteristic values M and C.

In the processing of the flow chart illustrated in FIG. 22, equivalent circuit model selection (S301) and processing used to calculate mutual inductance M and mutual capacitance C (S302) are the same as the processing of the flow chart illustrated in FIG. 9, and their explanation is therefore omitted.

When mutual inductance M is smaller than the minimum value Mmin and mutual capacitance C is smaller than the minimum value Cmin ("Yes" in S304), the substitution section 213 generates equivalent circuit data on the assumption that the equivalent circuit is an open circuit (S306). Namely, since mutual inductance M and mutual capacitance C are smaller than the minimum values, the amount of interference between inductors is considered so small as to be disregarded.

In case of "No" in S304, when mutual inductance M exceeds the maximum value Mmax and mutual capacitance C exceeds the maximum value Cmax ("Yes" in S305), the substitution section 213 generates equivalent circuit data on the assumption that the equivalent circuit is a short circuit (S307). Namely, because mutual inductance M and mutual capacitance C exceed the maximum values, the amount of interference between the inductors is large enough to conclude that there is a short circuit between the inductors.

In case of "No" in S305, as described in embodiment 1, the substitution section 213 generates equivalent circuit data produced by introducing mutual inductance M and mutual capacitance C calculated in S302 in the equivalent circuit model acquired in S301 (S303).

As described above, when mutual inductance M and mutual capacitance C exceed a certain range, the substitution of open circuits or short circuits for the equivalent circuits simplifies the generated equivalent circuit data. As a result, the amount of processing required for the subsequent analytical processing (S400) is reduced.

EMBODIMENT 3

Figure 23:
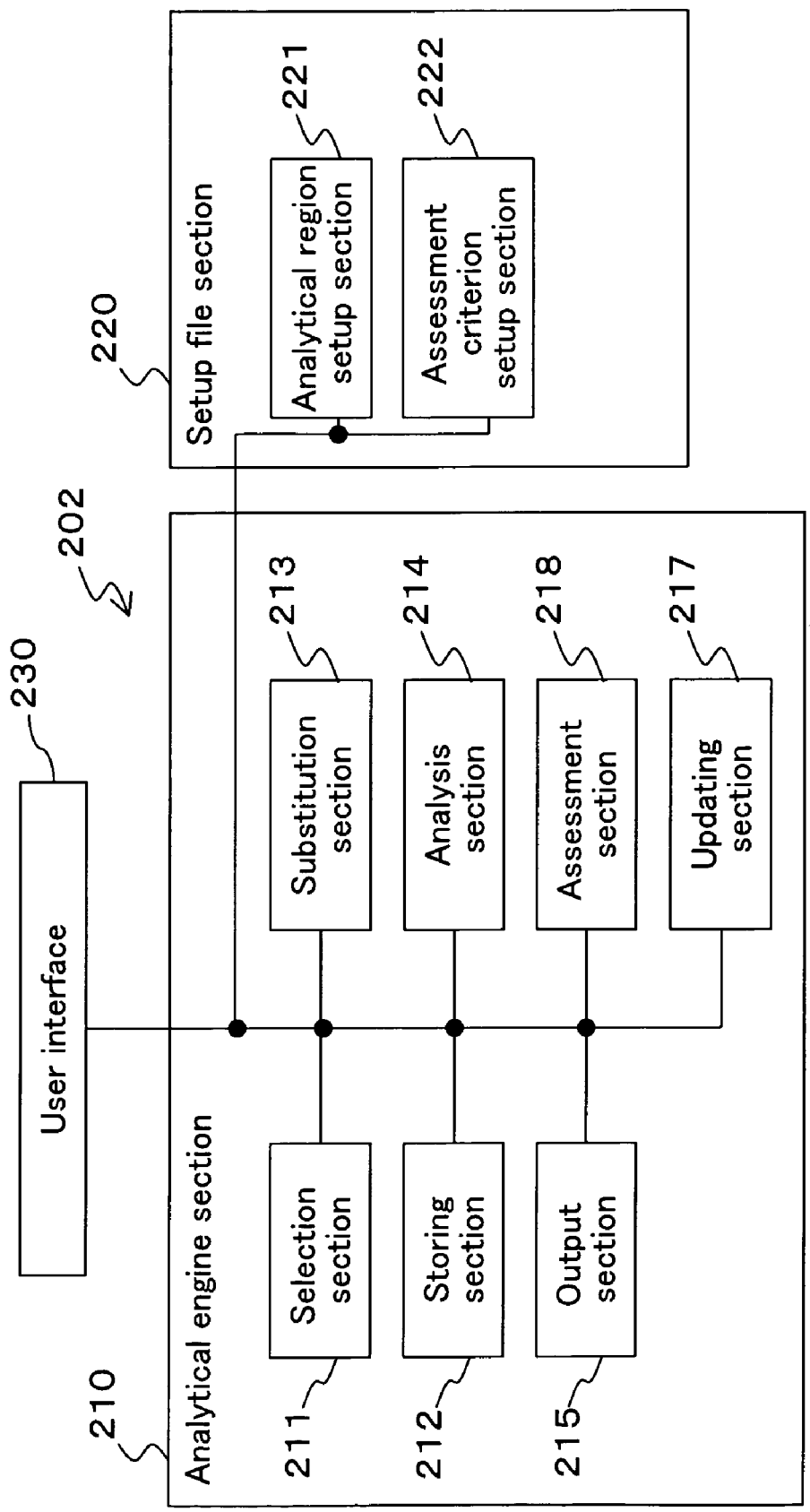
FIG. 23 is a functional block diagram representing the configuration of the design system 202.

FIG. 23 is a functional block diagram representing the configuration of a design system 202 used in Embodiment 3. In the design system 202 illustrated in FIG. 23, the same numbers are assigned to components identical to those of the design system 200 illustrated in FIG. 1, and their explanation is omitted.

The analytical engine section 210 of the design system 202 further comprises an updating section 217. The updating section 217 updates design data 25 recorded in the storing section 212 based on information input via the user interface 230

Figure 24:
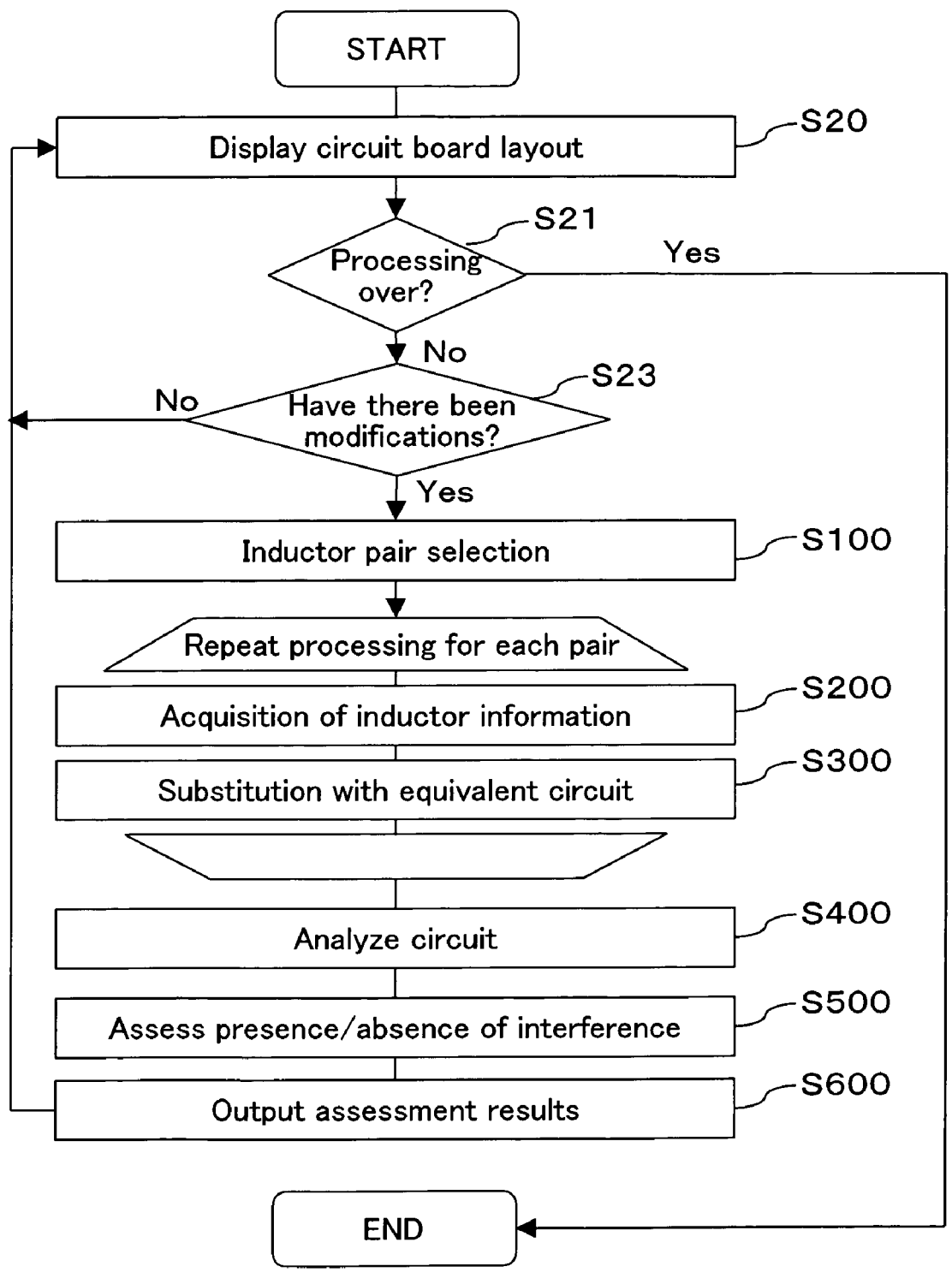
FIG. 24 is a flow chart illustrating an example of processing whereby the design system 202 displays interference analysis and analysis results in real time simultaneously with updating the design data 25.

FIG. 24 is a flow chart illustrating an example of processing whereby the design system 202 used in this embodiment displays interference analysis and analysis results in real time while updating the design data 25.

First of all, the layout of the circuit board represented by the design data 25 recorded in the storing section 212 is displayed by the output section 215 on the display device 107. The layout of the circuit board is recorded in the storing section 212, e.g. as layout data 24. The output section 215 can display screens, e.g. such as the one illustrated in FIG. 7.

When a termination indication is inputted by the user through the user interface 230 ("Yes" in S21), processing is terminated. An instruction to update the design data 25 is received from the user when there is no termination indication from the user (S23). For instance, a user interface may be provided in which the user can move the inductors 40 displayed on the screen illustrated in FIG. 7 by dragging and dropping them with a cursor. Whenever inductors displayed on screen are moved, the user interface 230 can detect an instruction to update the design data 25.

When the user interface 230 receives the instruction to update the design data 25 from the user ("Yes" in S23), the selection section 211 selects a pair of inductors formed on the circuit board represented by the design data 25 (S100). The subsequent processing, that is, processing involving inductor pair selection (S100), inductor information acquisition (S200), substitution of equivalent circuits (S300), circuit analysis (S400), interference presence assessment (S500), and output of assessment results (S600), is similar to the respective processing of the flow chart illustrated in FIG. 4. The above processing (S100~S600) is repeated whenever the design data 25 is updated by the user.

That is, when the updating of the circuit board design data 25 is performed by the user on screen, the analytical engine section 210 detects the updated information and performs interference analysis of the updated design data. As a result, for instance, when the user moves an inductor on the screen illustrated in FIG. 7, the presence/absence of interference between inductors is displayed in conjunction with the relocation. For instance, the presence/absence of interference is displayed as shown on the screen illustrated in FIG. 8. By doing so, the user can find the best location while simultaneously confirming changes in the degree of interference due to the relocation of the inductor.

Thus, the speed of interference analysis must be fast enough to perform interference analysis whenever the design data 25 changes and to display the results immediately. That is, the processing of S100 to S600 needs to be performed fast enough to follow the updating operations of the user. Because in the present embodiment the substitution section 213 substitutes equivalent circuits for electromagnetic coupling in inductor pairs and the analysis section 214 analyzes equivalent circuits for all the circuits including the substituted equivalent circuits, analysis can be carried out at a higher speed in comparison with conventional electromagnetic field analysis. As a result, interference can be assessed in real time simultaneously with the user's updating operations.

EMBODIMENT 4

In above-described embodiments 1 to 3, explanations primarily were focused on checking for electromagnetic interference within inductor pairs. In embodiment 4, further explanations are provided regarding an example in which the design system is imparted with functionality for automatically eliminating electromagnetic interference-induced faults.

The present inventor(s) have conducted an investigation aimed at determining whether useless space on circuit boards could be eliminated by reducing the distance between inductors if inductors of the same type having the same winding direction were attached to both terminals of a filter. However, quite naturally, unwanted electromagnetic coupling between inductors is produced if the distance between inductors is shortened. As a result, for instance, the attenuation characteristic of the filter installed between the inductors undergoes degradation.

However, the present inventor(s) experimentally studied a large number of combinations under such conditions and discovered a heretofore unnoticed law. According to the findings, when the placement is such that mutual inductance M between inductors positioned at both terminals of a filter becomes positive, resonance can be generated through combination with capacitive coupling due to parasitic capacitance between inductors, and the degradation of the filter's attenuation characteristic can be suppressed with the aid of this resonance. Here, the effect of suppression of degradation of the attenuation characteristic cannot be achieved if the placement is such that the mutual inductance is negative.

The present inventor's attempt to suppress the degradation of the attenuation characteristic of a filter through active magnetic coupling of inductors has not been undertaken up till now. This novel approach makes it possible to discard conventional configurations in which inductors had to be separated in order to decrease their mutual influence. Consequently, further miniaturization of circuit boards can be achieved readily. Technology related to the inductor placement method exploiting this unusual effect has been disclosed by the present inventor(s) in the Description of Japanese Patent Application No. 2004-271803, the disclosure of which is incorporated herein by reference. This technology can be applied to and incorporated in the design system for circuit boards described in the embodiments of the present invention. That is, arrangements that suppress degradation of filter characteristics even when inductors are placed adjacent to each other can be designed by adjusting the polarity of mutual inductance M between the inductors represented by the design data.

Figure 25:
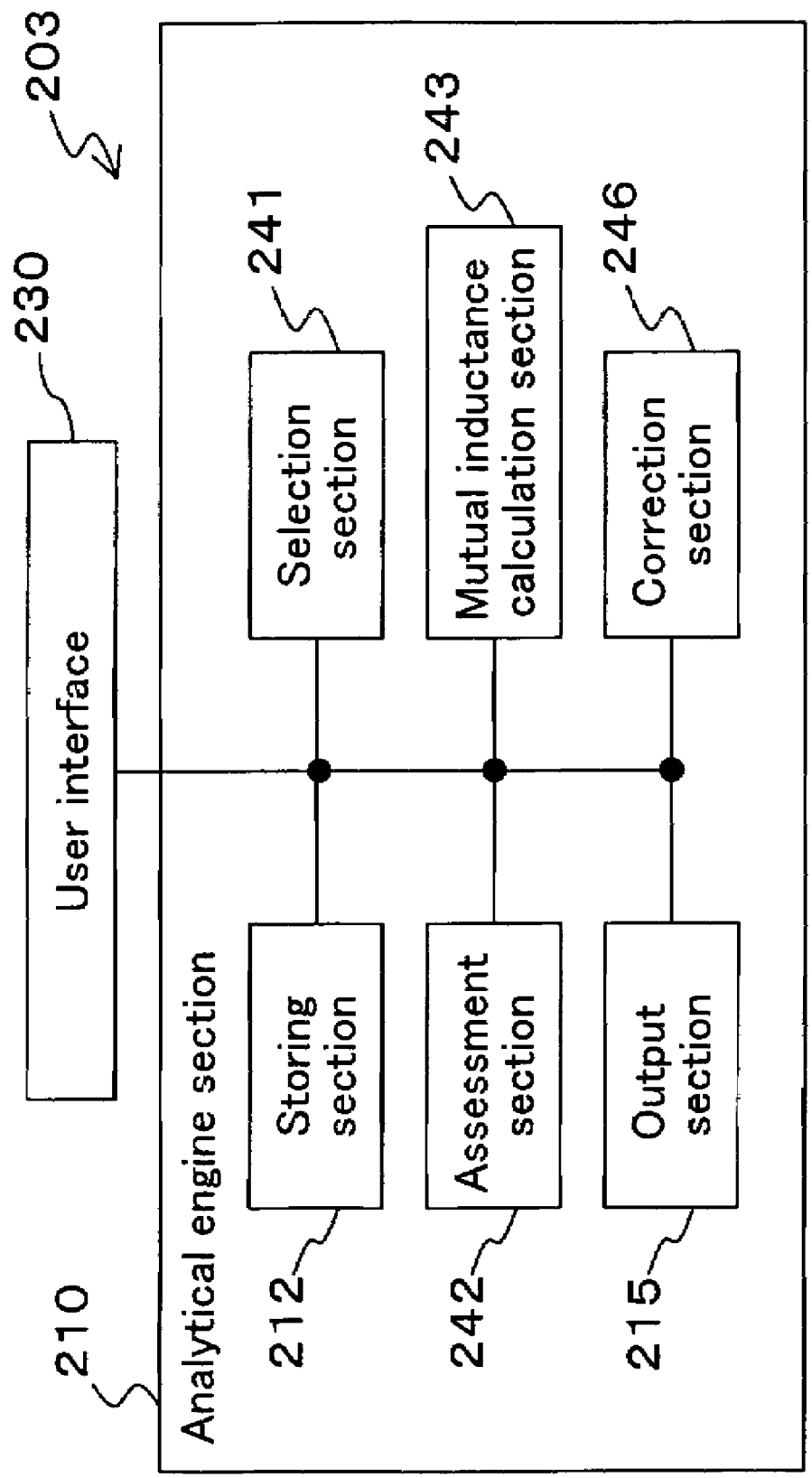
FIG. 25 is a functional block diagram representing the configuration of the design system 203.

FIG. 25 is a functional block diagram representing the configuration of the design system 203 used in the present embodiment. The design system 203 comprises a user interface 230 and an analytical engine section 210. The analytical engine section 210 comprises a storing section 212, a selection section 241, an assessment section 242, a mutual inductance calculation section 243, a correction section 246, and an output section 215.

Circuit board design data 25 is recorded in the storing section 212. The details of the design data are similar to those illustrated in FIG. 2. The selection section 241 selects, from the design data 25, at least two inductors to be processed among the inductors placed on the circuit board represented by the design data 25. The mutual inductance calculation section 243 calculates mutual inductance between the inductors selected by the selection section 241. The assessment section 242 makes an assessment as to whether the mutual inductance calculated by the mutual inductance calculation section 243 is positive or negative. When the mutual inductance is negative, the correction section 246 corrects the design data 25 so as to modify the placement of at least one inductor among the inductors selected by the selection section 241. The output section 215 displays the structure of the circuit board represented by the design data 25.

Figure 26:
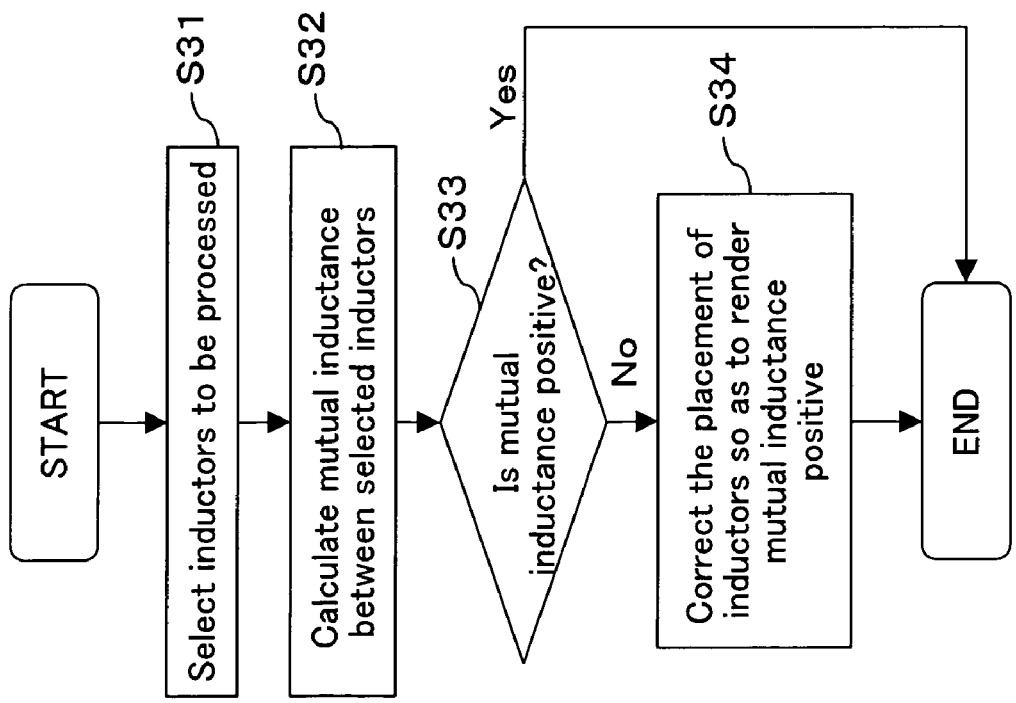
FIG. 26 is a flow chart illustrating an example of operations whereby the design system 203 corrects the design data 25 so as to automatically eliminate electromagnetic interference-induced faults between inductors provided on a circuit board.

Next, explanations are provided regarding an example of the operation of the design system 203. FIG. 26 is a flow chart illustrating an example of operation whereby the design system 203 corrects the design data 25 so as to automatically eliminate electromagnetic interference-induced faults between inductors provided on a circuit board. As illustrated in FIG. 26, an inductor connected to one of the terminals of a filter or amplifier placed on the circuit board represented by the design data 25 and a second inductor connected to the other terminal are selected by the selection section 241 from the design data 25 (S241). The selection section 241 may select pre-recorded inductors in the region subject to analysis, or may select inductors specified by the user through the user interface 230.

Figure 27:
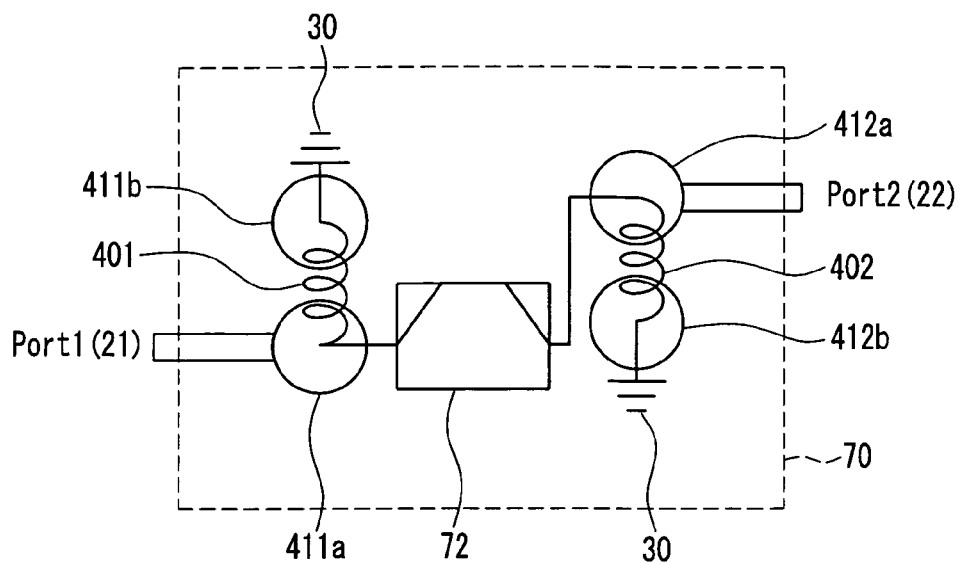
FIG. 27 illustrates an exemplary configuration of a filter circuit block.

FIG. 27 illustrates an exemplary configuration of a filter circuit block. In the circuit block 70 illustrated in FIG. 27, a first inductor 401 and a second inductor 402 are connected to both terminals of a filter 72. The selection section 241 selects, e.g. the inductor 401 and the inductor 402 illustrated in FIG. 27.

The electrode terminal 411a of the first inductor 401 is connected to wiring extending from one of the terminals of the filter 72. On the other hand, the electrode terminal 412a of the second inductor 402 is connected to wiring extending from the other terminal of the filter 72. It should be noted that in this example, electrode terminals 411b and 412b in the inductors 401, 402 on the sides that are not connected to the filter are connected to ground 30. Moreover, the filter circuit block 70 has a port 1(21) and a port 2(22). The electrode terminal 411a of the inductor 401 is connected to the port 1(21) and the electrode terminal 412a of the inductor 402 is connected to the port 2(22), respectively. The filter 72 is a band-pass filter, for which, for instance, a surface acoustic wave filter (SAW filter) can be used.

The mutual inductance calculation section 243 calculates mutual inductance between the inductors 401, 402 selected by the selection section 241 (S32). The process of mutual capacitance calculation is similar to the processing used to calculate mutual inductance M (S302) in FIG. 9. The assessment section 242 decides whether the calculated mutual inductance is positive (S33). When the mutual inductance is negative ("No" in S33), the correction section 246 applies a correction to above-mentioned design data 25 to modify the placement of the inductor 401 or the inductor 402 such that said mutual inductance is rendered positive.

In the configuration illustrated in FIG. 27, the polarity of the mutual inductance between the inductor 401 and inductor 402 varies depending on which terminal among the electrode terminal 411a and electrode terminal 411b of the inductor 401 is connected to the filter 72. Similarly, the polarity of the mutual inductance between the inductor 401 and the inductor 402 changes depending on which terminal among the electrode terminal 412a and electrode terminal 412b of the inductor 402 is connected to the filter 72.

Therefore, the correction section 246 can perform correction such that the mutual inductance between the inductors 401, 402 is rendered positive, for instance, by correcting the design data 25 in such a manner that the terminal of the inductor 401 connected to the filter 72 is switched from the electrode terminal 411a to the electrode terminal 411b. For example, connection information concerning the electrode terminals 411a and 411b of the inductor 401 is included, as connection information 83, in the element data 28 of the inductor 401 in the design data 25 (FIG. 2). Therefore, due to the correction applied by the correction section 246 to the connection information 83 of the inductor 401, the resultant design data 25 represents an arrangement that suppresses the degradation of the characteristics of the filter 72 connected between the inductor 401 and inductor 402.

Here, by referring to FIGS. 28 to 31, some basic explanations will be provided regarding the polarity of the mutual inductance. In FIGS. 28 through 31, a circuit diagram is illustrated in (a) and a diagram of its equivalent circuit is illustrated in B. It should be noted that said equivalent circuit can be generated by the substitution section 213 shown in FIG. 1.

Figure 28A:
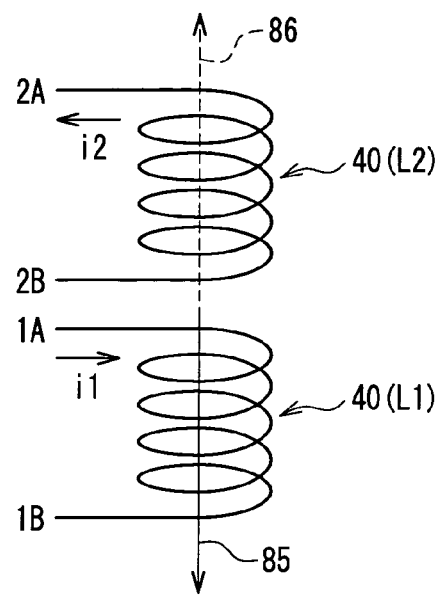
FIG. 28A is circuit diagram illustrating a configuration comprising an arrangement of two inductors.
Figure 28B:
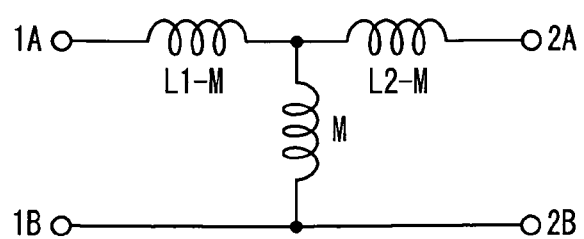
FIG. 28B is a diagram of an equivalent circuit for the circuit diagram illustrated in FIG. 28A.

The winding direction of the inductor 40(L1) and the winding direction of 40(L2), as shown in FIG. 28A, are the same. The inductors 40(L1) and 40(L2) are placed such that the direction of the flux of the magnetic field 85 generated by the inductor 40(L1) and the direction of the flux of the magnetic field 86 generated by 40(L2) are practically on the same straight line. Here, the self-inductance of the inductor 40(L1) is designated as L1 and the self-inductance of the inductor 40(L2) is designated as L2.

In the circuit illustrated to FIG. 28A, when an electric current $i_1$ flows at a certain point in time from the terminal 1A to the terminal 1B of the inductor 40(L1), a magnetic flux 85 is generated by the electric current $i_1$. At this point, a magnetic flux 86 is generated in the inductor 40(L2), canceling out the magnetic flux 85. Under the action of the magnetic flux 86, an electric current $i_2$ flows from the terminal 2B to the terminal 2A of the inductor 40(L2). If the circuit of FIG. 28A is translated into an equivalent circuit, it will look like the one shown in FIG. 28B, with mutual inductance M being positive in this case.

Figure 29A:
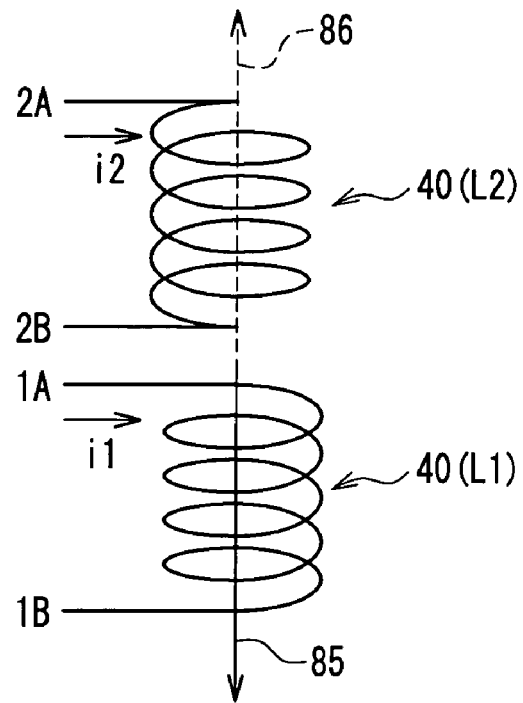
FIG. 29A is circuit diagram illustrating a configuration comprising an arrangement of two inductors.
Figure 29B:
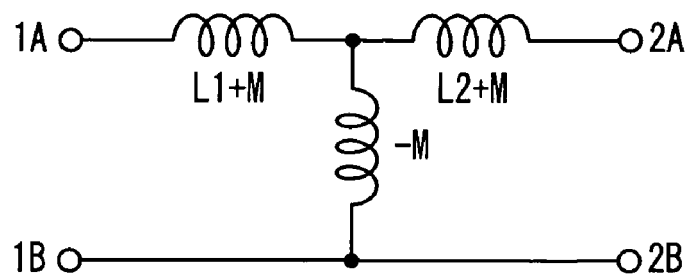
FIG. 29B is a diagram of an equivalent circuit for the circuit diagram illustrated in FIG. 29A.

FIG. 29A was obtained by reversing the winding direction of the coil of the inductor 40(L2) illustrated in FIG. 28A. In this case, mutual inductance M becomes negative, as illustrated in the equivalent circuit of FIG. 29B.

Figure 30A:
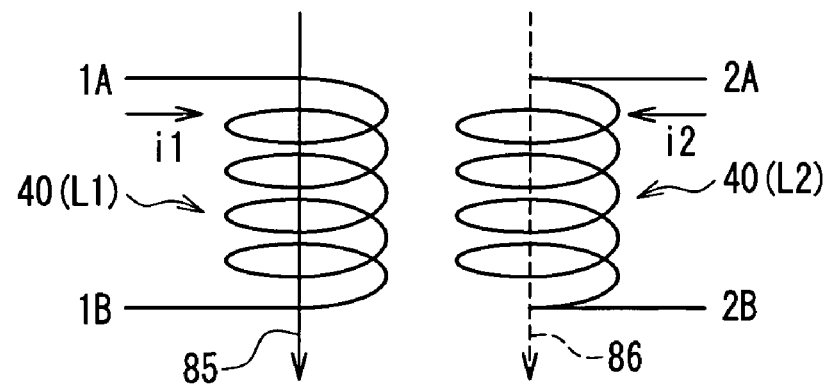
FIG. 30A is circuit diagram illustrating a configuration comprising an arrangement of two inductors.
Figure 30B:
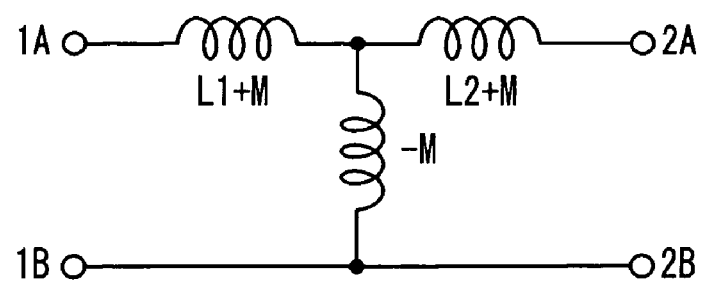
FIG. 30B is a diagram of an equivalent circuit for the circuit diagram illustrated in FIG. 30A.
Figure 31A:
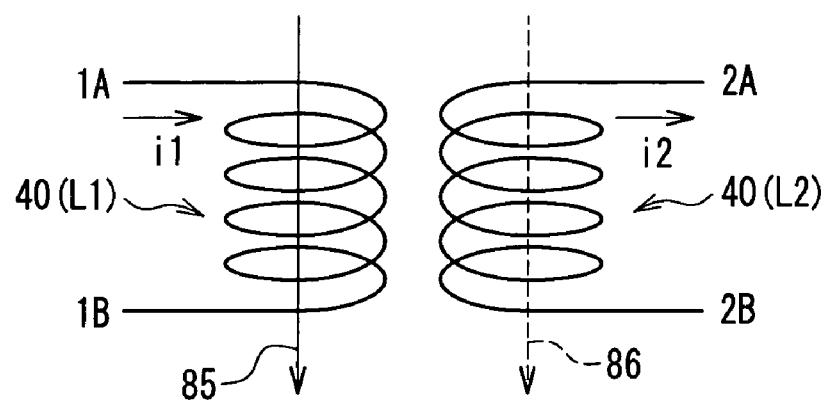
FIG. 31A is circuit diagram illustrating a configuration comprising a placement of two inductors.
Figure 31B:
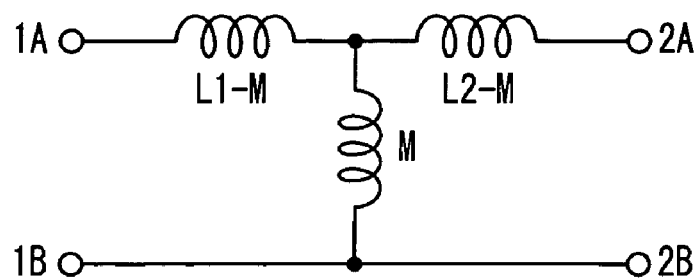
FIG. 31B is a diagram of an equivalent circuit for the circuit diagram illustrated in FIG. 31A.

Next, FIG. 30A was obtained by placing, side by side, inductors 40(L1) and 40(L2) having the same winding direction. Namely, the inductor 40(L1) and inductor 40(L2) are placed such that the direction of the magnetic flux 85 of the inductor 40(L1) and the direction of the magnetic flux 86 of the inductor 40(L2) are parallel to each other. In this case, mutual inductance M becomes negative, as illustrated in the equivalent circuit of FIG. 30B. On the other hand, the inductor 40(L2) illustrated in FIG. 31A was obtained by reversing the winding direction of the coil of the inductor 40(L2) illustrated in FIG. 30A. In this case, mutual inductance M becomes positive, as illustrated in the equivalent circuit of FIG. 31B.

Next, an example of placement of the inductors 401 and 402, whereby mutual inductance M in the circuit block 70 is rendered positive, will be illustrated with reference to FIG. 32 to FIG. 34.

Figure 32A:
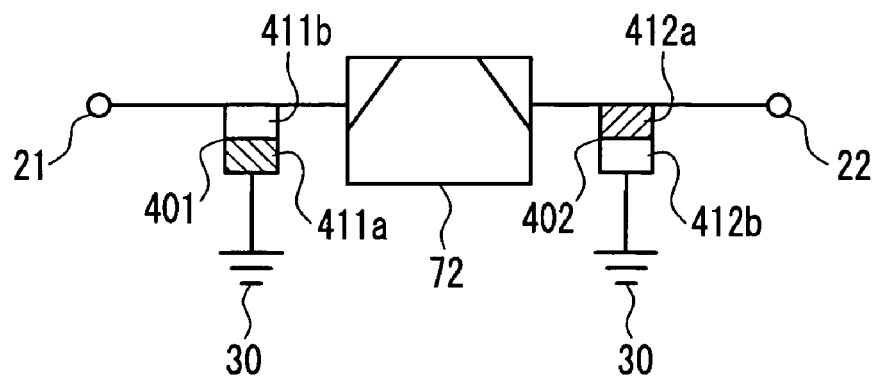
FIG. 32A and FIG. 32B illustrate examples of the placement of the inductor 401 and the inductor 402.

The circuit configuration illustrated in FIG. 32A represents the same configuration as the circuit configuration illustrated in FIG. 27. The electrode terminal 411a of the inductor 401 is connected to ground 30, and the electrode terminal 411b is connected to the filter 72 and port 21. The electrode terminal 412b of the inductor 402 is connected to ground 30, and the electrode terminal 412a is connected to the filter 72 and port 21. It should be noted that among the electrode terminals of the inductors 401, 402 shown in FIG. 32, terminals oriented in the direction of emergence of the lines of magnetic force generated when an electric current is caused to flow in the right-handed direction of the coils are represented as terminals marked with diagonal cross-hatching. In the inductors 401, 402, the marked terminals are the electrode terminals 411a and 412a. It should be noted that the winding direction of the inductor 401 and the winding direction of the inductor 402 are the same.

Figure 32B:
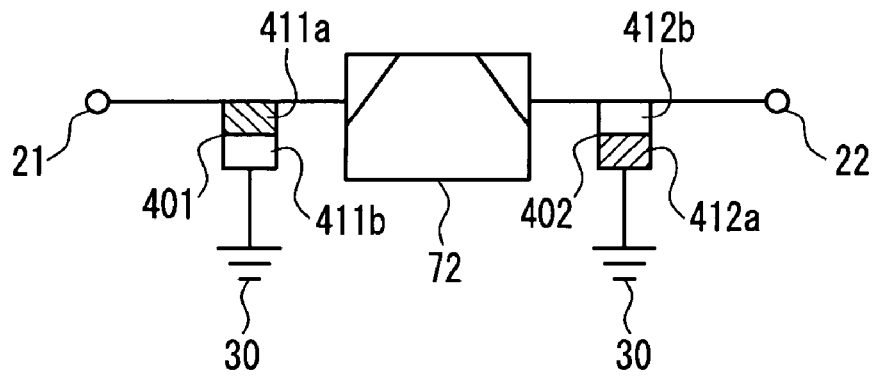
Figure 33A:
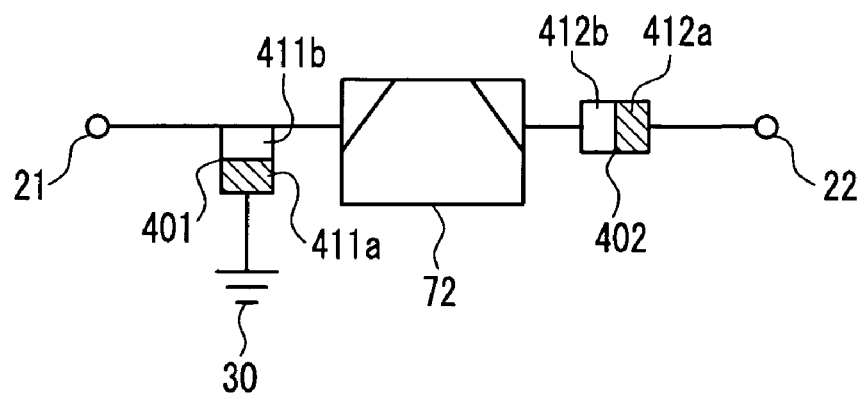
FIG. 33A and FIG. 33B illustrate other examples of the placement of the inductor 401 and the inductor 402.
Figure 33B:
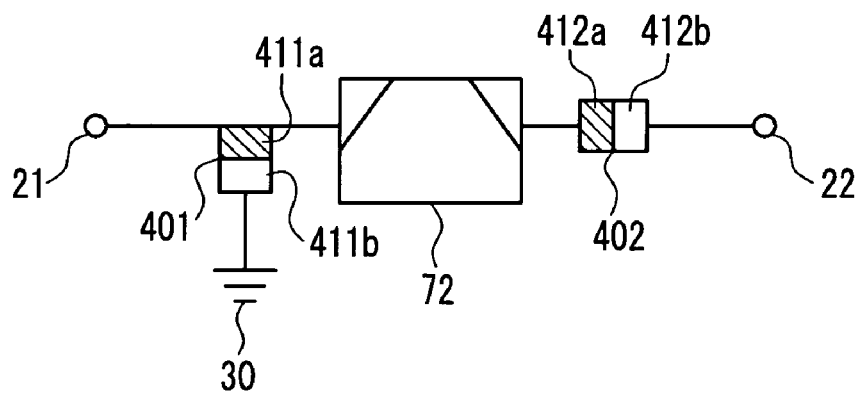
Figure 34A:
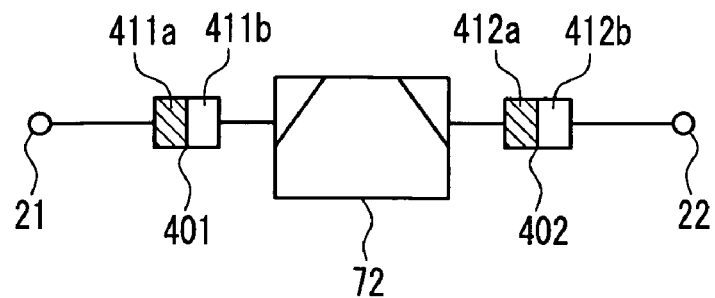
FIG. 34A and FIG. 34B illustrate additional examples of the placement of the inductor 401 and the inductor 402.
Figure 34B:
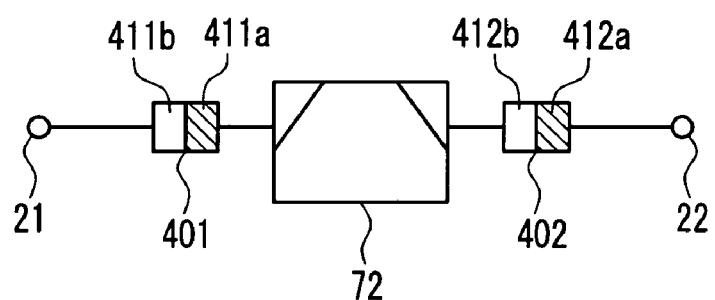

The circuit configuration illustrated in FIG. 32B represents a configuration obtained when the connection of the inductors 401, 402 is changed in the circuit configuration illustrated in FIG. 32A. Namely, the configuration illustrated in FIG. 32B was obtained by reversing the relationship of the terminals in the configuration illustrated in FIG. 32A. The electrode terminal 411b of the inductor 401 is connected to ground 30, and the electrode terminal 411a is connected to the filter 72 and port 21. The electrode terminal 412a of the inductor 402 is connected to ground 30, and the electrode terminal 412b is connected to the filter 72 and port 21. It should be noted that the way the terminals of FIG. 33A and FIG. 33B are reversed is the same as in the case of FIG. 32A and FIG. 32B. It should be noted that the way the terminals of FIG. 34A and FIG. 34B are reversed is the same as in the case of FIG. 32A and FIG. 32B.

As illustrated in FIG. 32A and FIG. 32B, when the different terminals, i.e. the electrode terminal 411a and electrode terminal 412b in the inductor 401 and inductor 402 are connected to ground 30, the mutual inductance M becomes positive. Put differently, if the same terminals, namely, the electrode terminal 411a and electrode terminal 412a in the inductor 401 and inductor 402 are connected to ground 30, mutual inductance M becomes negative. If the electrode terminal 411b and electrode terminal 412b are connected to ground 30, mutual inductance M also becomes negative. The correction section 246 carries out correction so as to render mutual inductance M positive by connecting different terminals to ground 30, in such a manner that mutual inductance M does not become negative. More specifically, such correction of the design data 25 aimed at rendering mutual inductance M positive is executed automatically by the computer 110 on which the design system 203 is based.

In addition, if the inductor 401 and inductor 402 are connected to the same terminals with regard to the port 21 and port 22, respectively, then the mutual inductance M becomes positive. Namely, if the inductors 401, 402 are connected in such a manner that the electrode terminal 411a and electrode terminal 412a, which are marked, or the electrode terminal 411b and electrode terminal 412b, which are not marked, are not connected to the ports 21, 22, mutual inductance M becomes positive. Put differently, if the inductor 401 and inductor 402 are placed in such a manner that the different electrode terminals 411a, 412b are connected to the port 21 and port 22, mutual inductance M becomes positive. This rule is applicable to other arrangements as well.

FIG. 33A and FIG. 33B illustrates a configuration, in which the inductor 402 is not connected to ground and is, instead, connected to the wiring in series. In this configuration, too, if the first inductor 401 and second inductor 402 are placed in such a manner that the different terminals (411a, 412a) are connected with regard to the port 21 and port 22, respectively, then the mutual inductance M becomes positive. For instance, in FIG. 33A, different terminals (411b, 412a) are connected with regard to port 21 and port 22, respectively. In FIG. 33B as well, different terminals (411a, 412b) are connected with regard to port 21 and port 22, respectively.

FIG. 34A and FIG. 33B illustrate a configuration in which neither inductor 401 nor inductor 402 are connected to ground and both are, instead, connected to the wiring in series. In this configuration, in the same manner, if the inductor 401 and inductor 402 are placed so that different terminals are connected with regard to port 21 and port 22, respectively, then the mutual inductance becomes positive. For instance, in FIG. 34A, different terminals (411a, 412b) are connected with regard to port 21 and port 22, respectively. In FIG. 34B as well, different terminals (411b, 412a) are connected with regard to port 21 and port 22, respectively.

Although FIGS. 32 through 34 illustrate configurations in which one of the respective inductors, either inductor 401 or inductor 402, is connected to the filter 72, the above-described correction method is also applicable to circuits of configurations in which other inductors are connected in addition to the inductors 401 and 402. In other words, the above-described correction method can be applied to configurations in which a third inductor is connected between the inductor 401 and the port 21, as well as to configurations in which a fourth inductor is connected between the inductor 402 and the port 22. In addition, configurations in which even more inductors are provided are also possible.

It should be noted that the influence of the inductor 401 and inductor 402 plays the most crucial role, and even thought the effect of suppression of filter characteristic degradation is somewhat diminished in arrangements with a third or fourth inductor, nevertheless, the effect of suppression of filter characteristic degradation still can be achieved.

However, rendering the mutual inductance M positive in the case of including a third inductor (and/or a fourth inductor) is also desirable from the standpoint of the effect of suppression of filter characteristic degradation. Processing enabling conversion to such arrangements is also feasible. In case of conversion to such arrangements, the mutual inductance becomes positive if the third and fourth inductor are placed in such a manner that different terminals are connected with regard to the first port 21 and second port 22, respectively.

Figure 35:
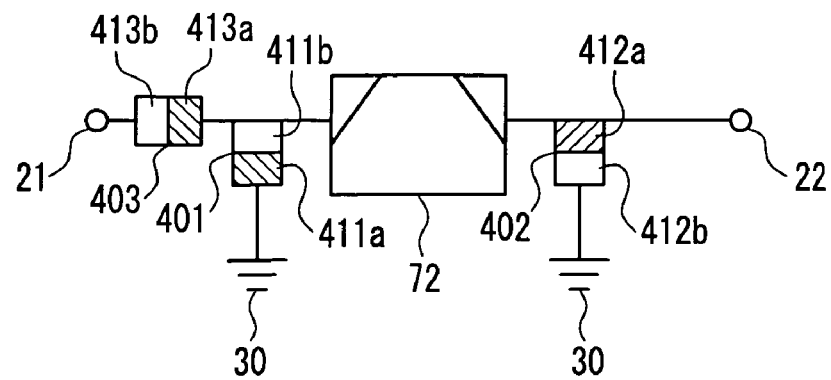
FIG. 35 illustrates an example of the placement of the inductor 401, the inductor 402, and the inductor 403.

FIG. 35 illustrates an example in which a third inductor 403 is added. In the example illustrated in FIG. 35, the electrode terminal 411b of the inductor 401 and the electrode terminal 413b of the inductor 403 are connected with the port 21. On the other hand, the electrode terminal 412a of the second inductor 402 is connected to the port 22. Therefore, the design is done in such a manner that different terminals (413b and 412a) (411a and 412b) are connected with regard to the port 21 and the port 22.

EMBODIMENT 5

Figure 36:
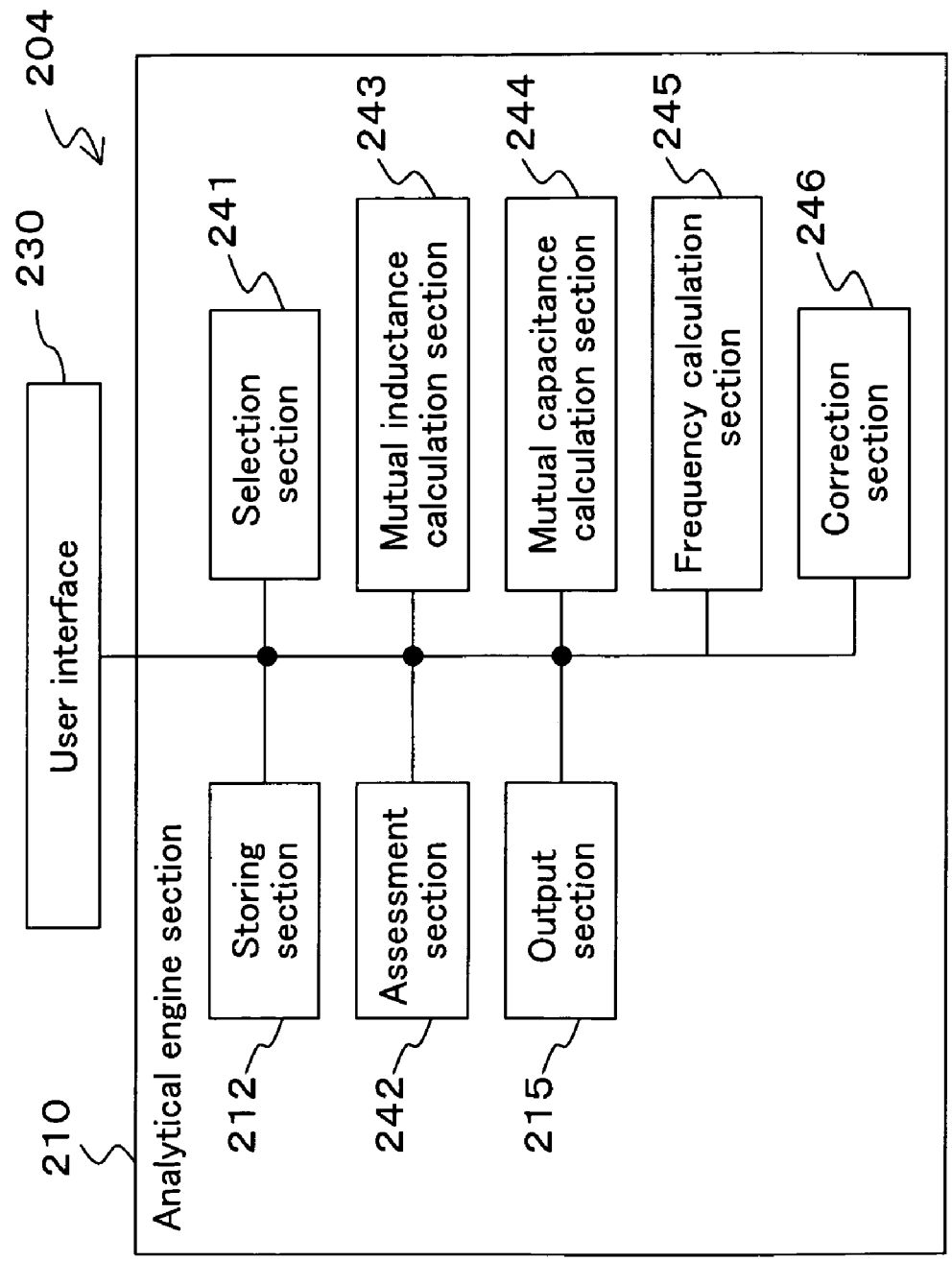
FIG. 36 is a functional block diagram representing the configuration of the design system 204.

FIG. 36 is a functional block diagram representing the configuration of the design system 204 used in the present embodiment. The design system 204 comprises a user interface 230 and an analytical engine section 210. The analytical engine section 210 comprises a storing section 212, a selection section 241, an assessment section 242, a mutual inductance calculation section 243, a mutual capacitance calculation section 244, a frequency calculation section 245, a correction section 246, and an output section 215.

Because the storing section 212, the selection section 241, the mutual inductance calculation section 243, and the output section 215 are similar to the functional block illustrated in FIG. 25, their explanation is omitted. Mutual Capacitance Calculation section 244 calculates the mutual capacitance within inductor pairs selected by the selection section 241. The frequency calculation section 245 calculates the resonance frequency for the inductor pair selected by the selection section 241. The resonance frequency is calculated using the mutual inductance calculated by the mutual inductance calculation section 243 and mutual capacitance calculated by Mutual capacitance Calculation section 244.

Assessment section 242 makes an assessment as to whether the resonance frequency calculated by the frequency calculation section 245 matches the frequency characteristic required of circuit elements between the inductors selected by the selection section 241. The correction section 246 applies a correction to the design data 25 of the storing section 212 so as to modify the distance within the inductor pairs selected by the selection section 241 in such a manner that the resonance frequency calculated by the frequency calculation section 245 matches the frequency characteristic required of circuit elements.

Figure 37:
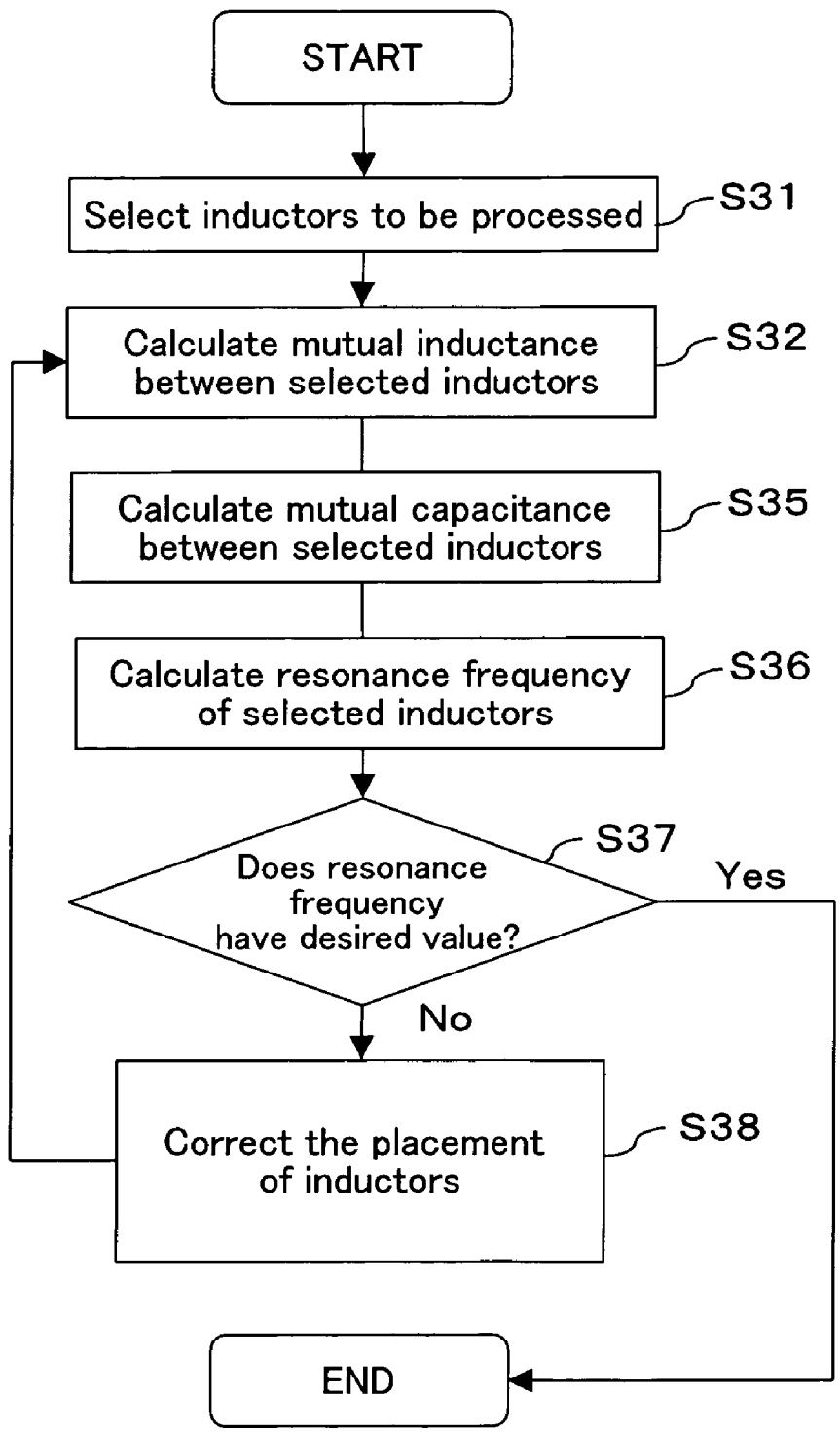
FIG. 37 is a flow chart illustrating operations whereby the design system 204 corrects the design data 25 such that the distance between inductors provided on the circuit board is appropriate for the frequency characteristics of the circuit elements provided between the inductors.

Next, explanations are provided regarding an example of operation of the design system 204. FIG. 37 is a flow chart illustrating operations whereby the design system 204 corrects the design data 25 such that the distance between inductors provided on a circuit board is appropriate for the frequency characteristics of circuit elements provided between the inductors.

As illustrated in FIG. 37, first of all, an inductor connected to one of the terminals of a filter located on the circuit board represented by the design data 25 and a second inductor connected to the other terminal are selected by the selection section 241 from the design data 25 (S31). The selection process is similar to the selection process (S31) of the flow chart illustrated in FIG. 26. For instance, the items selected are the inductors 401, 402 provided at both terminals of the filter 72 illustrated in FIG. 27.

Next, the mutual inductance calculation section 243 calculates mutual inductance between the inductors 401, 402 selected by the selection section 241 (S32). The calculation process is also similar to the mutual inductance calculation process (S32) of the flow chart illustrated in FIG. 26.

Mutual Capacitance Calculation section 244 calculates the mutual capacitance between the inductors 401, 402 selected by the selection section 241 (S33). The process of mutual capacitance calculation is similar to the processing used to calculate mutual capacitance C (S302) in FIG. 9.

The frequency calculation section 245 calculates the resonance frequency for the inductor pair selected by the selection section 241. The resonance frequency is calculated using mutual inductance M calculated by the mutual inductance calculation section 243 and mutual capacitance C calculated by Mutual Capacitance Calculation section 244, e.g. based on the following (Expression 1).

$$f = \frac{a}{2p} \times \frac{1}{\sqrt{L1 \cdot L2}} \times \sqrt{\frac{|M|}{C}} \qquad \text{(Expression 1)}$$

In Expression 1 above, α is a constant and L is the self-inductance of the inductors 401, 402 selected by the selection section 241.

The assessment section 242 determines the difference between the resonance frequency calculated by the frequency calculation section 245 and the desired frequency of the filter 72, for instance, the resonance frequency of the filter 72, and makes an assessment as to the sign of the mutual inductance M and as to whether the difference falls within the prescribed range (S37). Processing is terminated if the difference is in the prescribed range ("Yes" in S37). If the difference exceeds the prescribed range, the correction section 246 corrects the distance between the inductors 401, 402 (S38). It should be noted that when the mutual inductance M is negative, it is preferable for the correction section 246 to modify the placement of the inductors 401, 402 in order to render it positive.

The correction section 246 determines, for instance, the distance D between the inductors 401, 402, at which the resonance frequency between the inductors 401, 402 approaches the resonance frequency of the filter 72. The correction section 246 corrects the design data 25 such that the distance between the inductors 401, 402 is made to coincide with the required target distance D. The change in the distance between the inductors 401, 402 causes the mutual capacitance C to change. As a result, the resonance frequency obtained above (Expression 1) changes as well. In this manner, the desired resonance frequency is obtained by adjusting the distance between the inductors 401, 402.

When the correction section 246 corrects the design data 25, the processing of S32 to S37 is repeated for the corrected design data 25. The correction section 246 repeats the correction process (S38) until the distance D assumes the appropriate value and it is determined by the assessment section 242 that the desired resonance frequency has reached the desired frequency. By doing so, the distance between the inductors 401, 402 is adjusted so as to match the frequency characteristic of the filter 72.

Moreover, based on Expression 1 above, the correction section 246 can obtain the respective resonance frequencies for a plurality of distances D and use the distance D, at which the target resonance frequency becomes closest to the desired frequency, as the optimum distance.

Moreover, the assessment section 242 makes an assessment as to whether the sign of the mutual inductance M is positive or negative, and the correction section 246 corrects the mounting directions of the inductors 401, 402 with respect to each other according to the sign of mutual inductance M. For instance, when the sign of mutual inductance M is positive, the correction section 246 may correct the design data 25 in such a manner that the mounting direction of the inductors 401, 402 will match the configuration examples illustrated in FIGS. 32~34.

Figure 38:
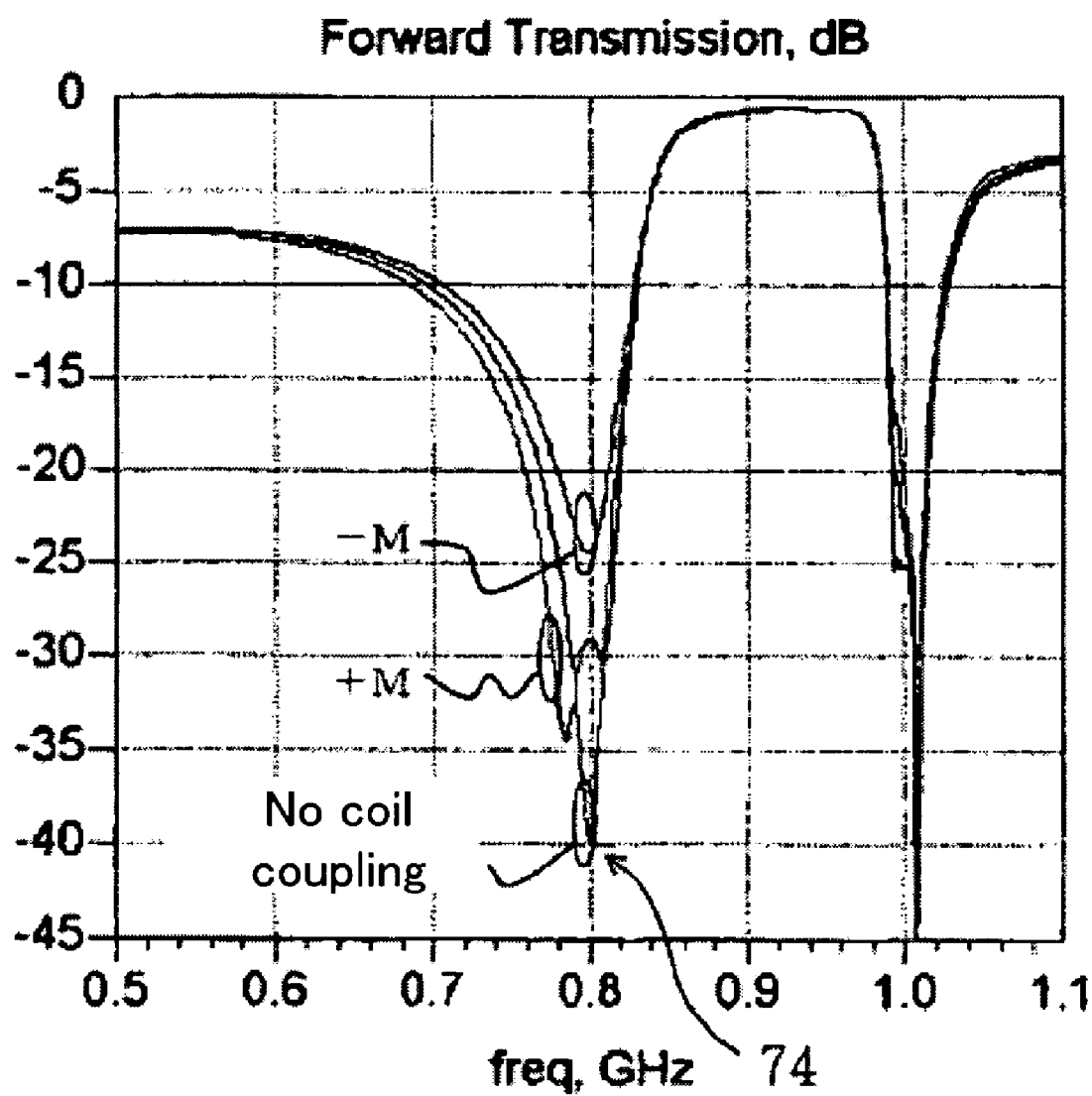
FIG. 38 is a graph representing the band-pass filter characteristic of the circuit block 70.

FIG. 38 is a graph representing the band-pass filter characteristic of the circuit block 70 illustrated in FIG. 27. In the graph of FIG. 38, the unit for the X-axis is GHz, and the unit for the Y-axis is dB. The graph illustrated in FIG. 38 represents the band-pass filter characteristic obtained when the mutual inductance M between the inductors 401, 402 is positive (+M), when the mutual inductance M is negative (−M), and, for reference purposes, when the two are spaced apart so much that electromagnetic coupling essentially disappears (no electromagnetic coupling). It should be noted that electromagnetic coupling is sometimes called coil coupling or inductive coupling.

Here, when the distance between the inductor 401 and the inductor 401 is large enough (see curve marked "No coil coupling"), the attenuation pole 74 of the filter 72 is not affected significantly by the coil coupling of the inductors and no degradation of filter properties (attenuation characteristic degradation) is observed. On the other hand, when the distance between the inductor 401 and the inductor 402 is reduced and the influence of inductor coupling starts to appear, the degradation of filter properties becomes evident (the "−M" curve).

However, even if the distance between the inductor 401 and the inductor 402 is reduced, when the inductor 401 and the inductor 402 are placed so that mutual inductance M of the inductor 401 and the inductor 402 is rendered positive, the degradation of filter properties is suppressed (the "+M" curve).

While the phenomenon has not been discovered up till now and the exact details of the reasons for such results are not known yet, it has been discovered that when a pair of inductors 40 is placed at the two terminals of a filter 72, it is preferable to make the mutual inductance M within said pair of inductors 40 positive.

It is believed that when mutual inductance M is positive (+M), resonance is generated based on a combination of inductive coupling produced by mutual inductance between the inductor 401 and the inductor 402 and capacitive coupling produced by mutual capacitance between the inductors L1 and L2, and the pole (attenuation pole) generated as a result can suppress the degradation of filter properties. The frequency f (resonance frequency) generated by the pole can be calculated using Expression 1 above.

Because the factors forming part of Expression 1 above can be calculated using the design system 204 of the present embodiment, the design system 204 enables circuit design that makes use of the resonance.

The design method of Embodiments 4 and 5, which makes use of the design system 204, consists not in keeping the inductors 401, 402 at the two terminals of the filter 72 mutually spaced apart in order to eliminate the influence of interference between the inductors 401, 402, but rather in placing them within a range in which the inductors 401, 402 exert mutual influence (e.g. within 2 mm). In this manner, it is possible to realize designs, in which an attenuation characteristic resulting from coupling between the inductors 401, 402, which is separate from the attenuation characteristic of the filter 72, is introduced into the filter circuit block 70 and allows it to show excellent filter properties. Therefore, circuit designs capable of achieving miniaturization while suppressing the degradation of filter characteristics can be realized under the design method of the present embodiment based on the use of the design system 204.

Although Embodiments 4 and 5 illustrated cases in which the inductors 401, 402 were placed at the two terminals of the filter 72, circuit elements installed between the inductors 401, 402 are not limited to the filter 72. For instance, the present invention is applicable to cases in which the inductors 401, 402 are placed at the two terminals of an amplifier. For instance, the inductors 401, 402 can be placed at the two terminals of an amplifier for the purpose of impedance matching. Then, when the inductors 401, 402 are placed adjacent to each other, a feedback path is generated between the amplifier's input-output terminals as a result of unwanted electromagnetic coupling between the inductors 401, 402, thereby causing degradation of properties, such as oscillation etc. Therefore, in the same manner as with the filter 72, even in case of an amplifier, a circuit design can be developed that suppresses electromagnetic coupling-related property degradation by correcting the design data to produce a configuration that renders mutual inductance between the inductors 401, 402 positive. That is, the same effects are produced even when the inductors 401, 402 are placed at the two terminals of an amplifier. The amplifier (amplifying device) can be, for example, a high-frequency power amplifier. It should be noted that the same effects are achieved even in case of structures which switches, shared antenna devices, or balun, etc. are installed between the inductors 401, 402.

Circuit boards designed using the design system of the above-described Embodiments 1 to 5 can be used suitably for telecommunications equipment equipped with wireless circuits (RF circuits). In particular, since circuit boards designed using the design system of Embodiments 1 to 5 are miniaturized, they can be used in the wireless circuit blocks of mobile phones, which have limited space for mounting components. Put differently, since the miniaturization of circuit boards with limited space presents considerable difficulties and such circuit design is quite costly, the effects achieved by using the design system of Embodiments 1 to 5 are very substantial. It should be noted that the design system of Embodiments 1 to 5 is not limited to portable telecommunications equipment such as mobile phones and can be applied widely to the design of electronic equipment.

The circuit board design system of Embodiments 1 to 5 is not limited to printed circuit board design and can also be applied to the design of semiconductor integrated circuits. In other words, it is possible that the design system of Embodiments 1 to 5 may be applicable not only to printed board CAD, but also to CAD used for semiconductor integrated circuits. The reason for this is that the ability to check automatically for influence of interference between inductor elements on the substrate on a computer constitutes a considerable advantage in the design of semiconductor integrated circuits.

When the design of semiconductor integrated circuits is carried out with the help of the design system of Embodiments 1 to 5, in the same manner, after selection of an inductor pair subject to interference analysis by the selection section, the substitution section acquires information concerning the inductors from an information database and substitutes an equivalent circuit for the circuit containing the inductor pair based on the acquired information. Subsequently, the analysis section carries out interference analysis of the equivalent circuit. An actual inductor value (L-value) accounting not only for self-inductance but also for the mutual inductance can be estimated accurately based on the above-described processing. As a result, a design system can be offered that can design semiconductor integrated circuits with excellent performance.

In particular, when semiconductor integrated circuits do not meet the prescribed performance criteria due to poor accuracy of estimated inductor values, semiconductor integrated circuit design, mask design, and semiconductor integrated circuit manufacture have to be carried out again. However, if the design system of the present Embodiments 1 to 5 is used, such problems can be eliminated because circuits can be examined and problems can be corrected in the process of semiconductor integrated circuit design.

Despite the fact that above the present invention was explained by referring to preferred embodiments, such descriptions are not limiting, and various modifications of the invention are, of course, also possible. For instance, the design method of the present invention can be based on installing a program directing an ordinary CAD device or computer to carry out the above-described processing. In this sense, technical features and intellectual property value can be present in the program itself.

A circuit design program that carries out circuit design with the aid of a computer can be stored on a computer-readable storage medium. Such a program can be recorded, for instance, in the ROM 102 (in some cases, an external storage device 104) and/or RAM 103 of a general-purpose computer 110, whose configuration is illustrated in FIG. 3, which makes it possible to build a design system 200 as shown in FIG. 1.

Such a program should be able to direct the computer to carry out a step (a) of selecting an inductor pair subject to interference analysis, a step (b) of acquiring information concerning the inductors from an information database, a step (c) of substituting an equivalent circuit for the circuit containing the inductor pair based on the acquired information, and a step (d) of carrying out interference analysis of the equivalent circuit. In addition, the program may direct it to execute processing explained in the above-described embodiments in addition to the steps (a) to (d).

The program can be recorded on computer-readable storage media. The storage media may include, for instance, optical storage media (CD-ROMs and DVDs, etc.), magneto-optical recording media (MOs etc.), magnetic memory media (HDD and floppy disks™, etc.), and semiconductor memory elements (flash memory, etc.). Moreover, the program can be communicated using carriers, for example, through the Internet, cable or wireless LANs.

It should be noted that the explained Embodiments 1 to 5 are no more than mere illustrations of an example of the present invention and the present invention is not to be construed in a limiting sense because of these embodiments. The scope of the present invention is indicated not by the above-described embodiments, but by the scope of patent claims, and all modifications within the scope and meaning of the claims and equivalents are considered as part thereof.

The present invention can provide a design system, a design method, and a circuit design program for circuit boards or semiconductor integrated circuits that accounts for electromagnetic interaction between inductors.

The present invention can be embodied in various forms without departing from its spirit and essential features. The embodiments disclosed in the present Application should be construed as intended for explanation in all respects and should not be interpreted as limiting. The scope of the present invention is not the Description provided above, and is indicated by the appended claims, and all modifications that fall within the scope of the claims and equivalents are considered as part of the claims.

What is claimed is:

1. A design system equipped with capability to analyze design data for a circuit board having circuit elements and wiring placed thereon, comprising:
   a storing section that stores the design data, including structure data representing a structure of the circuit elements and wiring placed on the circuit board, circuit data representing circuits built from the circuit elements and the wiring, and element data concerning the circuit elements;
   a selection section that selects a pair of circuit elements that are spaced apart from each other and are subject to interference analysis among the circuit elements placed on the circuit board represented by the structure data;
   a substitution section that acquires element data concerning the circuit elements selected by the selection section from the design data and generates, based on the element data, equivalent circuit data representing electromagnetic coupling within the space between the pair of circuit elements using an equivalent circuit; and
   an analysis section that calculates an amount of interference within the pair of circuit elements by analyzing data obtained by combining the equivalent circuit data with the circuit data.

2. The design system according to claim 1, further comprising a model storing section that stores an equivalent circuit model of electromagnetic coupling occurring within a pair of circuit elements,
   wherein the substitution section acquires the equivalent circuit model from the model storing section and generates the equivalent circuit data using the acquired equivalent circuit model.

3. The design system according to claim 1, wherein the substitution section uses the element data acquired from the design data to calculate values representing characteristics of the equivalent circuit and generate the equivalent circuit data.

4. The design system according to claim 3, further comprising a setup file section tat stores, as condition data, data representing maximum and minimum values of values representing the characteristics of the equivalent circuit,
   wherein the substitution section generating the equivalent circuit data by considering the equivalent circuit as an open circuit when the value representing the characteristics of the equivalent circuit is greater than the maximum value and considering the equivalent circuit as a short circuit when the value representing the characteristics of the equivalent circuit is smaller than the minimum value.

5. The design system according to claim 4, further comprising a setup file section that stores, as condition data, data comprising data representing a frequency domain subject to analysis and a range of an amount of interference between circuit elements that are to be taken into consideration, and
   a characteristic value range determination section that obtains the maximum value and the minimum value of the value representing the characteristics of the equivalent circuit based on the frequency domain and the range of the amount of interference.

6. The design system according to claim 1, further comprising a setup file section that stores, as condition data, data representing a region subject to analysis on the circuit board,
   wherein the selection section selects a pair of circuit elements located within the region represented by the condition data.

7. The design system according to claim 1, further comprising a setup file section that stores, as condition data, data representing assessment criteria for the amount of interference between circuit elements, and
   an assessment section that provides an assessment of the presence/absence of interference within the pair of circuit elements by comparing the assessment criteria with the amount of the interference within the pair of circuit elements calculated by the analysis section.

8. The design system according to claim 1, further comprising a setup file section that stores, as condition data, a maximum value of a distance between the circuit elements subject to analysis,
   wherein the selection section selects a pair of circuit elements that are spaced at a distance not greater than the maximum value.

9. The design system according to claim 1, further comprising a setup file section that stores condition data representing the conditions of processing at least in either one of the selection section, the substitution section, and the analysis section, and
   a user interface accepting information input from users and recording the condition data in the setup file section based on the information input.

10. The design system according to claim 1, further comprising an output section that displays information representing an amount of interference within the, pair of circuit elements obtained by the analysis section in association with a configuration of a circuit board represented by the design data.

11. The design system according to claim 1, wherein the design data includes data representing net groups obtained by grouping similar nets among nets contained in the circuits of a circuit board into a single group, and,
    in a case where there is a plurality of net groups, the selection section selects a circuit element connected to a certain net group and a circuit element connected to another net group as the pair of circuit elements.

12. The design system according to claim 1, wherein the selection section selects an inductor pair as the pair of circuit elements, and
    the substitution section acquires, as the element data, at least information representing coordinates of the elements of the inductors, information representing a direction of placement of the inductors, information representing electrical connections of the terminals of the inductors, and information representing the characteristics of the inductors.

13. A design system equipped with capability to analyze design data for a circuit board having circuit elements placed thereon, comprising:
    a storing section that stores design data representing the circuit board and circuit elements placed thereon,
    a display section that displays a configuration of the circuit board and circuit elements represented by the design data on screen,
    an updating section that updates a configuration of the circuit elements displayed by the display section based on information input from outside,
    a selection section that selects a pair of circuit elements that are spaced apart from each other and are subject to interference analysis among circuit elements placed on the circuit board represented by the design data when the configuration of the circuit elements is updated by the updating section, a substitution section that acquires element data concerning the circuit elements selected by the selection section from the design data and generates equivalent circuit data produced by substitution with an equivalent circuit for electromagnetic coupling within the space between the pair of circuit elements based on the element data, an analysis section that obtains an amount of interference within the pair of circuit elements by analyzing circuits obtained by reflecting the equivalent circuit data in the circuits of the circuit board represented by the design data, and the display section displays data representing the interference amount obtained by the analysis section along with the updated circuit elements when the configuration of the circuit elements is updated by the updating section.

14. A design system for a circuit board containing a plurality of inductors, comprising:

a storing section that records design data for the circuit board, a selection section that selects a first inductor connected to one of the terminals of a circuit element placed on the circuit board and a second inductor connected to another terminal corresponding to said terminal from the design data, a polarity assessment section that provides an assessment as to whether a mutual inductance between the first inductor and the second inductor is positive or negative, and a correction section that applies corrections to the design data when the mutual inductance is negative such that art orientation of the first inductor or the second inductor is modified in order to render said mutual inductance positive.

15. A design system for a circuit board having a plurality of inductors placed thereon, comprising:

a storing section that stores design data for the circuit board, a selection section that selects a first inductor connected to one of the terminals of a circuit element with at least two terminals placed on the circuit board and a second inductor connected to an other terminal corresponding to said terminal from the design data, a capacitance calculation section that calculates parasitic capacitance between the first inductor and the second inductor, a mutual inductance calculation section that calculates a mutual inductance between the first inductor and the second inductor;

a frequency calculation section that obtains a resonance frequency of the first inductor and the second inductor, expressed using the parasitic capacitance and the mutual inductance, and a correction section that applies corrections to the design data so as to modify a distance between the first inductor and the second inductor in order to match the resonance frequency to the frequency characteristics required for the circuit elements.

16. The design system according to claim 15, wherein the frequency calculation section obtains the resonance frequency using the Expression 1 below, in which L1 is the self-inductance of the first inductor, L2 is the self-inductance of the second inductor, M is the mutual inductance between the first inductor and the second inductor, C is the parasitic capacitance, and $\alpha$ is a constant $$f = \frac{\alpha}{2\pi} \times \frac{1}{\sqrt{L1 \cdot L2}} \times \sqrt{\frac{|M|}{C}}. \qquad \text{Expression 1}$$

17. The design system according to claim 14, wherein the winding direction of the first inductor and the winding direction of the second inductor are the same.

18. An analysis method for, utilizing a computer, analyzing design data, including structure data representing a structure of circuit elements and wiring placed on a circuit board, circuit data representing circuits built from the circuit elements and the wiring, and element data concerning the circuit elements, the analysis method comprising:

a selection step, in which a selection section provided in the computer selects a pair of circuit elements that are spaced apart from each other and are subject to interference analysis from among circuit elements located on the circuit board represented by the structure data;

a substitution step, in which a substitution section provided in the computer acquires element data concerning the circuit elements selected in the selection step from the design data and, based on the element data, generates equivalent circuit data representing electromagnetic coupling within the space between the pair of circuit elements using an equivalent circuit; and an analytical step, in which an analysis section provided in the computer analyzes data obtained by combining the equivalent circuit data and the circuit data in order to calculate an amount of interference within the pair of circuit elements.

19. A recording medium storing an analysis program directing a computer to carry out processing to analyze design data including structure data representing a structure of circuit elements and wiring placed on a circuit board, circuit data representing circuits built from the circuit elements and the wiring, and element data concerning the circuit elements, the program directing a computer to carry out:

selection processing, during which a pair of circuit elements that are spaced apart from each other and are subject to interference analysis is selected from among the circuit elements placed on the circuit board represented by the structure data;

substitution processing, during which element data concerning the circuit elements selected during the selection processing is acquired from the design data and, based on the element data, equivalent circuit data is generated that represents electromagnetic coupling within the space between the pair of circuit elements using an equivalent circuit; and analytical processing, during which data obtained by combining the equivalent circuit data with the circuit data is analyzed to calculate an amount of interference within the pair of circuit elements.

* * * * *